(12) United States Patent
Suzuki et al.

(10) Patent No.: US 8,638,121 B2
(45) Date of Patent: Jan. 28, 2014

(54) SEMICONDUCTOR DEVICE

(76) Inventors: Takamasa Suzuki, Tokyo (JP); Akira Kotabe, Hino (JP); Tomonori Sekiguchi, Richmond (GB); Riichiro Takemura, Tokyo (JP)

( * ) Notice: Subject to any disclaimer, the term of this patent is extended or adjusted under 35 U.S.C. 154(b) by 0 days.

(21) Appl. No.: 13/429,056

(22) Filed: Mar. 23, 2012

(65) Prior Publication Data

US 2012/0249180 A1 Oct. 4, 2012

(30) Foreign Application Priority Data

Mar. 30, 2011 (JP) ................................. 2011-075963

(51) Int. Cl.
*H03K 19/0175* (2006.01)

(52) U.S. Cl.
USPC ................... 326/81; 326/58; 326/68; 327/333

(58) Field of Classification Search
USPC ............... 326/56–58, 63, 68, 80–81; 327/333
See application file for complete search history.

(56) References Cited

U.S. PATENT DOCUMENTS

| | | | |
|---|---|---|---|
| 6,344,764 B2 | 2/2002 | Tanzawa | |
| 6,351,173 B1 * | 2/2002 | Ovens et al. | 327/333 |
| 6,710,638 B2 * | 3/2004 | Morikawa | 327/333 |
| 7,042,245 B2 | 5/2006 | Hidaka | |
| 7,161,387 B2 * | 1/2007 | Yamasaki et al. | 326/81 |
| 7,355,455 B2 | 4/2008 | Hidaka | |
| 2010/0026366 A1 * | 2/2010 | Wang et al. | 327/333 |

FOREIGN PATENT DOCUMENTS

| | | |
|---|---|---|
| JP | 2000-151385 | 5/2000 |
| JP | 2004-147175 | 5/2004 |

OTHER PUBLICATIONS

C. Q. Tran, "95% Leakage-Reduced FPGA using Zigzag Power-gating, Dual VTH/VDD and Micro-VDD—Hopping," Asian Solid State Circuits Conference, pp. 149-152, 2005.

* cited by examiner

*Primary Examiner* — Jason M Crawford

(57) ABSTRACT

A device is disclosed herein, which may be used a level-shift circuit. The device includes first, second and third power supply lines supplied respectively with first, second and third power voltages that are different from one another, first and second input terminals and an output terminal, an output circuit coupled to the first power supply line, the first and second input terminals and the output terminal, a first inverter including an input node coupled to the first input terminal and an output node coupled to the second input terminal, a first transistor coupled in series to the first inverter between the second and third power supply lines, the first transistor being rendered non-conductive to deactivate the first inverter, and a control circuit configured to prevent the output terminal from being brought into an electrical floating state during deactivation of the first inverter.

20 Claims, 16 Drawing Sheets

FIG. 11

| CONDUCTIVITY TYPE | | THRESHOLD VALUE Vth(V) | NAMES OF TRANSISTORS, INVERTERS OR LATCHES | | | | | | | |
|---|---|---|---|---|---|---|---|---|---|---|
| HIGH VOLTAGE WITHSTANDING (WITH THICK GATE OXIDE FILM) Tr. | P | -0.36 (enhancement) | M2 | M3 | M12 | M13 | | | IH2 | IH3 |
| | P | -0.06 (enhancement) | M4 | M5 | M9 | | | | | |
| | N | +0.36 (enhancement) | M6 | M7 | M10 | M11 | M14 | | IH2 | IH3 |
| | N | +0.06 (enhancement) | M0 | M1 | M8 | | | | | |
| LOW VOLTAGE WITHSTANDING (WITH THIN GATE OXIDE FILM) Tr. | P | -0.18 (enhancement) | M17 | M23 | M25 | M27 | M29 | M31 | M34,M35 ;*1 | LAT2 | | M35 |
| | P | +0.12 (depletion) | M19 | M21 | | | | | | | |
| | N | +0.18 (enhancement) | M16 | M22 | M24 | M26 | M28 | M30 | M32,M33 ;*1 | LAT1 | M32, M33 | M34 |
| | N | -0.12 (depletion) | M18 | M20 | | | | | | | |

*1; appears in circuit diagram of conventional example

FIG. 16A
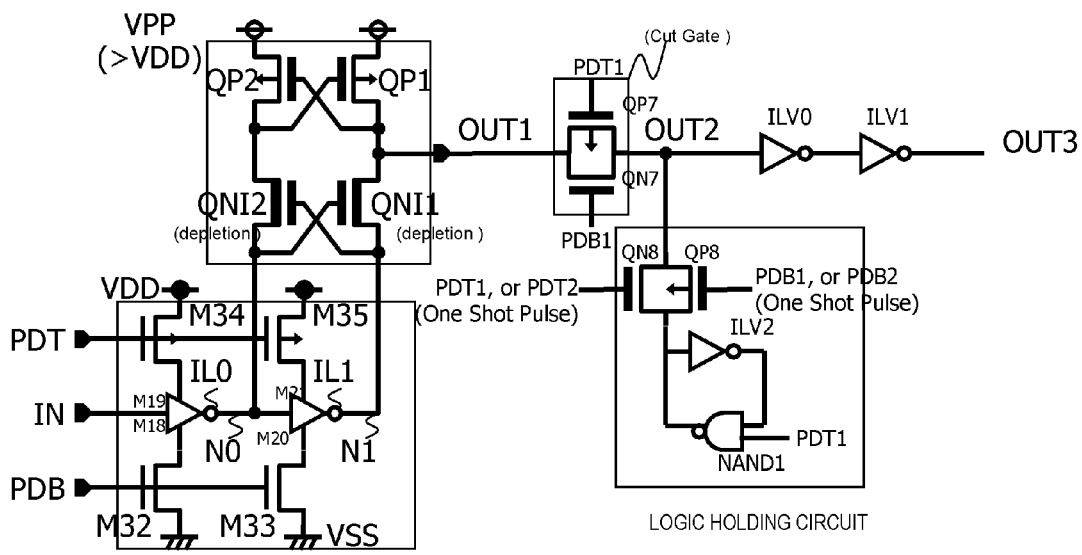
FIG. 16B
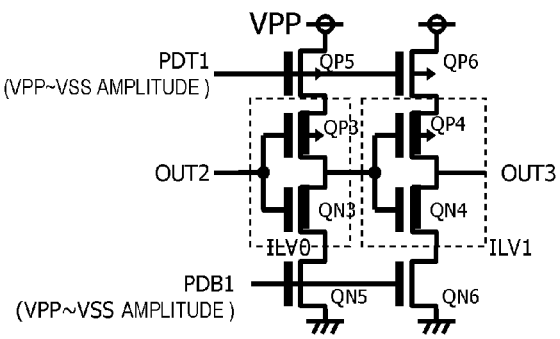
FIG. 16C
| HIGH WITHSTAND VOLTAGE | | |
|---|---|---|
| Pch. | -0.36V | QP1,QP2,QP5~8,ILV0~2,NAND1 |
| | -0.06V | QP3,QP4 |
| Nch. | +0.36V | QN5~8,ILV0~2,NAND1 |
| | +0.06V | QN3,QN4 |

SEMICONDUCTOR DEVICE

REFERENCE TO RELATED APPLICATION

This application is based upon and claims the benefit of the priority of Japanese patent application No. 2011-075963, filed on Mar. 30, 2011, the disclosure of which is incorporated herein in its entirety by reference thereto.

This invention relates to a semiconductor device and, more particularly, to a semiconductor device that may be used in advantage for voltage level conversion.

TECHNICAL FIELD

1. Background

A voltage level shifter, also termed as a level converter, shifts a voltage level of a first signal having a first amplitude to a second signal having a second amplitude. For example, the voltage level shifter shifts a voltage level of a first signal having a lower amplitude between VSS and VDD (VSS-VDD), so that the high level of the first signal is shifted to VPP, where VPP (>VDD) is a boosted power supply voltage, to produce a resulting signal, as a second signal having a higher amplitude between VSS and VPP (VSS-VPP). In another configuration, the voltage level shifter shifts a voltage level of a first signal having an amplitude of VSS-VDD, so that the low level of the first signal is shifted to VKK, where VKK (<VSS) is a negative power supply voltage, to produce a resulting signal, as a second signal having an amplitude between VKK and VDD (VKK-VDD).

In Patent Document 1, there is disclosed a voltage level shifter that is adapted to operate at a high speed even though a voltage level of the power supply voltage VDD is lowered.

In Patent Document 2, it is shown that a common power supply provided for a plurality of inverters connected in cascade to compose an inverter chain, is connected to a power-gating control circuit.

[Patent Document 1]
JP Patent Kokai Publication No. JP2000-151385A, which corresponds to U.S. Pat. No. 634,476

[Patent Document 2]
JP Patent Kokai Publication No. JP2004-147175A, which corresponds to U.S. Pat. No. 7,042,245 and U.S. Pat. No. 7,355,455

The following is the result of analysis of the conventional and related techniques by the present inventors.

2. Related Art

Following describes an analysis of a voltage level shifter of a related art semiconductor device with reference to FIGS. 15A and 15B. The circuit configuration is based on the disclosure in FIG. 1 of Patent Document 1. Referring to FIG. 15A, the voltage level shifter includes a P-channel (PMOS) transistor QP1 that has a source connected to a boosted power supply voltage terminal VPP, and a P-channel transistors QP2 that has a source connected to VPP, and has a gate and a drain respectively connected to a drain and a gate of the transistor QP1, an N-channel (NMOS) transistor (QNI1) that has a drain connected to the drain of the transistor QP1, a gate connected to an output of an inverter IL0 (node N0) and a source connected to an output of an inverter IL1 (node N1), an N-channel transistor (QNI2) that has a gate connected to the output of the inverter IL1 (node N1) and a source connected to the output of the inverter IL0 (node N0). The level shifter also includes inverters IL0 and IL1, each of which is arranged between the power supplies VDD and VSS. The inverter IL0 receives an input signal IN having an amplitude between VSS and VDD and inverts the input signal IN to produce an inverted signal at the node N0. The inverter IL1 receives and inverts the signal at the node N0 to produce the inverted signal at the node N1. A connection node of the drains of the transistors QP1 and QNI1 is connected to an output terminal OUT1. Threshold voltages of the N-channel transistors QNI1 and QNI2 are set to a low value of about 0V.

FIG. 15B illustrates voltage waveforms at the nodes IN, N0, N1 and OUT1 in FIG. 15A and a power supply current waveform I (VDD).

When IN is Low (=VSS), the output nodes N0 and N1 of the inverters IL0 and IL1 are set to High and Low, respectively. Thus, the transistor QNI1 is turned on (made conductive) and its drain goes LOW. This causes the transistor QP2 to be turned on and hence the gate of the transistor QP1 is pulled up to the boosted power supply voltage VPP through the transistor QP2, so that the transistor QP1 is turned off. As a result, the output terminal OUT1 is at a Low level (VSS).

When IN is High (=VDD), the output nodes N0 and N1 of the inverters IL0 and IL1 are set to Low and High, respectively. Thus, the transistor QNI2 is turned on, and the transistor QNI1 is turned off. The drain of transistor QNI2 goes Low. This causes the transistor QP1 to be turned on, so that the output terminal OUT1 is at VPP. The gate voltage of the transistor QP2 is VPP, so that the transistor QP2 is turned off. At this time, the transistor QNI1, a threshold voltage of which is close to 0V, has a source voltage=VDD, a drain voltage=VPP, a back gate voltage (substrate bias voltage) =VSS (0V), and a gate voltage=VSS (0V). The gate-to-source voltage of the transistor QNI1 is −VDD and hence the transistor QNI1 is in an off state, in which a drain-to-source current of the transistor QNI1 scarcely flows. When the level shift operation is carried out, one of the transistors QNI1 and QNI2 is turned on and the other is turned off. Since the gate-to-source voltage of one of the transistors QNI1 and QNI2 that is turned off assumes a minus voltage, there is no increase in a leakage current during the level shift operation, thus allowing a high-speed operation.

The inventors of the present application conducted the following analyses and found the following problems to be solved in connection with Patent Document 1. If in case the power supply voltage VDD is further decreased in the voltage level shifter shown in FIG. 15A, the operation with equivalent performance is to be maintained, it is necessary to further reduce threshold values of MOS transistors (not shown) included in the inverters IL0 and IL1 as well as threshold values of the N-channel transistors QNI1 and QNI2.

If the threshold values of these transistors are decreased, leakage currents (off-state leakage currents Ioff: also termed as sub-threshold currents) in the inverters IL0 and IL1 are increased. Since an absolute value of a gate-to-source voltage of a low threshold voltage MOS transistor that is cut off is decreased, an off-state leakage current, flowing through the low threshold voltage MOS transistor, is further increased (This is a result of the analysis by the inventors of the present application). This will now be further described.

For example, when the voltage level of IN during a wait state (standby state) is Low (=VSS), the gate of the transistor QNI1 goes High (VDD), so that the transistor QNI1 is turned on. The gate voltage of the transistor QP2 is Low as at the node N1, so that the transistor QP2 is turned on. In this state, an off-state leakage current flows along a route: VPP→P-channel transistor QP2→N-channel transistor QNI2 (with a gate voltage=Low)→inverter IL0 (P-channel transistor with a gate voltage=Low)→VDD. An off-state leakage current also flows along a route: VPP→P-channel transistor QP2→N-channel transistor QNI2 (with a gate voltage=VSS)→inverter IL0 (N-channel transistor with a gate voltage=Low)→VSS.

An off-state leakage current further flows on a route: VPP→P-channel transistor QP1 (with a gate voltage=High) →N-channel transistor QNI1 (with a gate equal to High) >inverter IL1 (N-channel transistor with a gate equal to High→VSS.

PROTOTYPE EXAMPLE

To overcome the above problems in the circuit configuration shown in FIG. 15A, the present inventors conducted the following investigations, with reference to the Patent Documents 1 and 2, for example, and found further problems. The following describes a circuit configuration shown in FIG. 16A, as a first prototype example. It is noted that the circuit configuration of FIG. 16A is drafted by the present inventors to assist in understanding the problems and is not a drawing disclosed in any known publications or documents. Specifically, a power gating circuit (see FIG. 1 of Patent Document 2) is applied to a portion of the circuit of FIG. 15A (inverters IL0 and IL1). Also, FIG. 16B shows a second prototype example which is a further development from FIG. 16A showing the first prototype example. Specifically, in the configuration shown in FIG. 16B, a power gating circuit (see FIG. 1 of Patent Document 2) is applied to ILV0 and ILV1 of FIG. 16A. In addition, the configuration shown in FIG. 16A includes a CMOS transfer gate (cut gate) and a logic holding circuit. FIG. 16C shows a list of threshold values of transistors in FIGS. 16A and 16B.

The prototype example, shown in FIG. 16A, includes an N-channel transistor M32 arranged between the low potential side power supply terminal of the inverter IL0 in FIG. 15A and VSS, a P-channel transistor M34 arranged between the high potential side power supply terminal of the inverter IL0 and VDD, an N-channel transistor M33 arranged between the low potential side power supply terminal of the inverter IL1 and VSS, a P-channel transistor MP35 arranged between the high potential side power supply terminal of the inverter IL1 and VDD. A power gating control signal PDT is supplied to gates of the P-channel transistors M34 and M35, and a signal PDB which is complementary to the signal PDT is supplied to gates of the N-channel transistors M32 and M33. The signals PDT and PDB are respectively made High and Low, during a standby state, and are respectively made Low and High during an active state (level shift operation). The prototype example also includes P-channel transistors QP1 and QP2 that have sources connected in common to the power supply VDD, and have gates and drains cross-coupled to each other, and N-channel transistors QNI1 and QNI2 that have sources respectively connected to the nodes N1 and N0, and have gates and drains cross-coupled to each other. The inverter IL0 includes a P-channel transistors M19 and an N-channel transistors M18. The inverter IL1 includes a P-channel transistors M21 and an N-channel transistors M20. It should be noted that transistors QP1, QP2, QNI1 and QNI2 and the inverters IL0 and IL1 correspond to the transistors QP1, QP2, QNI1 and QNI2, and the inverters IL0 and IL1 in FIG. 15A.

The output node OUT1 of the voltage level shifter is connected to a node OUT2 via a CMOS transfer gate including a P-channel transistor QP7 that has a gate receiving a control signal PDT1 and an N-channel transistor QN7 that has a gate receiving a control signal PDB1 which is a complementary signal of PDT1. The node OUT2 is connected to an output node OUT3 via the inverters ILV0 and ILV2. The control signals PDT and PDB1 are of the same logic as the control signals PDT and PDB, respectively, but differ therefrom in a voltage amplitude.

The node OUT2 is connected to an input of the inverter ILV2 via a CMOS transfer gate including an N-channel transistor QN8 that has a gate receiving the control signal PDT1 or PDB2, and a P-channel transistor QP8 that has a gate receiving the signal PDB1 or PDB2. An output of the inverter ILV2 is connected to a second terminal of a 2-input NAND circuit NAND1 that has a first terminal receiving the control signal PDT1. It is noted that the 2-input NAND circuit NAND1 operates as an inverter when the PDT1 is High, while an output of the 2-input NAND circuit NAND1 is fixed at High in case the PDT1 is Low. An output of the NAND1 is connected to an input of the inverter ILV2. When the PDT1 is High, the CMOS transfer circuit (QN8 and QP8) is made conductive. The inverter ILV2 and the NAND1 which operates as an inverter, constitute a latch circuit, and holds the value of OUT2 immediately before the PDT1 goes High and the transfer gate (QP7 and QN7) is made non-conductive. The control signals PDT2 and PDB2, which are supplied respectively to the gates of the N-channel transistor QN8 and the P-channel transistor QP8, are one-shot pulse signals. These one-shot pulse signal is such a signal that turns on the N-channel transistor QN8 and the P-channel transistor QP8, responsive to the transition of the control signals PDT and PDB.

Referring to FIG. 16B, the inverter ILV0 includes a P-channel transistor QP3 and an N-channel transistor QN3 that have gates connected in common to OUT2 and have drains coupled together, a P-channel transistor QP5 that has a source connected to VPP, has a drain connected to a source of the P-channel transistor QP3, and has a gate receiving PDT1, an N-channel transistor QN5 that has a source connected to VSS, has a drain connected to a source of the N-channel transistor QN3, and has a gate receiving the PDB1. The inverter ILV1 includes a P-channel transistor QP4 and an N-channel transistor QN4 that have gates connected in common to coupled drains of transistors QP3 and QN3, and have drains connected in common to OUT3, a P-channel transistor QP6 that has a source connected to VPP, has a drain connected to a source of the P-channel transistor QP4 and has a gate receiving PDT1, an N-channel transistor QN6 that has a source connected to VSS, has a drain connected to a source of the N-channel transistor QN4 and has a gate receiving PDB1.

During a standby state, PDT and PDT1 are set to High and PDB and PDB1 are set to Low. The respective power supply paths of the inverters IL0 and IL1 are cut off, that is, become non-conductive. The nodes N1 and N0 are in a floating state (an indefinite state). With PDT1=High and PDB1=Low, the CMOS transfer gates (QP7, QN7) are made non-conductive. The respective power supply paths of the inverters ILV0 and ILV1 are cut off, that is, become non-conductive. The OUT3 is in a high impedance state.

By power gating control during the standby state, off-leakage currents flowing through the inverters IL0 and IL1, respectively as well as off-leakage currents flowing through the low threshold N-channel transistors QNI1 and QNI2, respectively, may be decreased. Hence, the problem inherent in the circuit configuration of FIG. 15A may be overcome.

However, in the configuration of FIGS. 16A and 16B, the logic of the node OUT1 becomes indefinite, during the standby state (PDT=High, PDB=Low), because the node OUT1 is unable to maintain the logic of IN (Low or High). The nodes N0 and N1 are both at an indefinite level, i.e., an intermediate voltage between VSS and VDD, irrespectively of the level of the input IN. When the voltage at the node N0 is higher than that at the node N1, the node OUT1 assumes also an intermediate voltage between VSS and VPP. Hence, in case power gating is not adopted for the circuitry following the node OUT1, a short-circuit current flows through the circuitry following the node OUT1, thus increasing current consumption.

To prevent this from occurring, a CMOS transfer gate (QP7 and QN7) and a logic holding circuit to maintain the logic at the node OUT2, as shown in FIG. 16A, which is based on a study of Patent Documents 1 and 2, are required. During the standby state, the logic holding circuit holds the logic value at the node OUT2 just before the standby.

On the other hand, even though a power gating such circuit as shown in FIG. 16B, which is based on a study of Patent Documents 1 and 2, is used in a circuit (ILV0 and ILV1) disposed in a stage following OUT1, a logic holding circuit which is to be connected to the node of OUT2 or OUT3 is indispensable. This logic holding circuit is required to implement a resume function (function to restore the information which is latched immediately before a standby state, during restoration from the standby state to an active state). In FIG. 16A, there is provided the logic holding circuit that holds the value at the node OUT2. In the prototype example shown in FIG. 16A, it is necessary to use at least eight components, as transistors, for the logic holding circuit (QN8, QP8, two transistors for an inverter and four transistors for NAND). All of these transistors need to be high voltage withstanding transistors. Hence, a chip area increases with increase in the number of the circuit elements.

SUMMARY

In one aspect of the disclosure, there is provided a device that includes first, second and third power supply lines supplied respectively with first, second and third power voltages that are different from one another, first and second input terminals and an output terminal, an output circuit coupled to the first power supply line, the first and second input terminals and the output terminal, a first inverter including an input node coupled to the first input terminal and an output node coupled to the second input terminal, a first transistor coupled in series to the first inverter between the second and third power supply lines, the first transistor being rendered non-conductive to deactivate the first inverter, and a control circuit configured to prevent the output terminal from being brought into an electrical floating state during deactivation of the first inverter.

In another aspect of the disclosure, there is provided a device that includes a voltage level shifter, wherein an output of a power gating (PWG) circuit is connected to an input node of the voltage level shifter, and in an input part or the inside of the voltage level shifter, there is provided a logic holding circuit to enable a logic at an output node of the voltage level shifter to be held at a logic value corresponding to that of the input signal of the PWG circuit during power gating.

According to the present invention, a leakage current during a standby state is suppressed in the voltage level shifter as well as in circuits arranged in preceding and succeeding stages. The circuit area may be suppressed from increasing. The level shifter is able to output, at the time of returning from a standby state to an active state, a logic level immediately before the voltage level shifter entered into the standby state, without necessity of additionally providing a circuit such as a logic holding circuit in a stage following a voltage level shifter.

BRIEF DESCRIPTION OF THE DRAWINGS

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

FIG. 11 is a diagram showing a list of characteristics of different transistors of the embodiments.

FIGS. 16A, 16B and 16C show prototype examples of a voltage level shifter.

EMBODIMENTS

Figure 1:
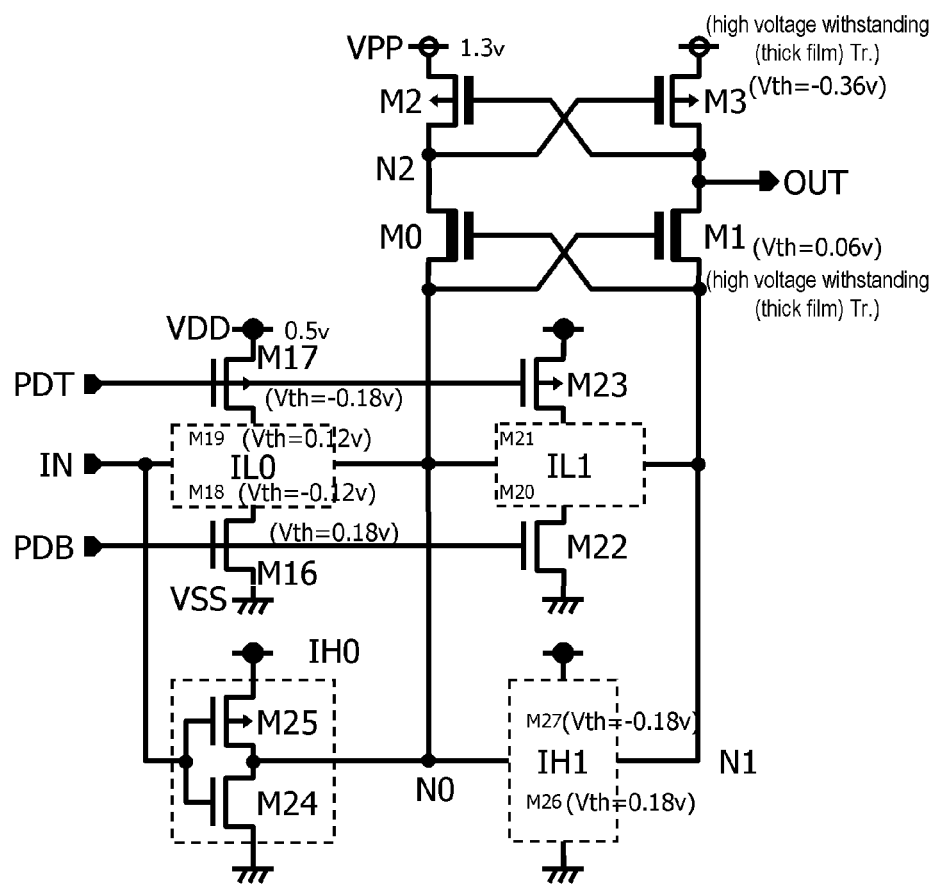
FIG. 1 is a diagram showing a circuit configuration of an embodiment 1 of the present invention.

Referring to FIG. 1, a voltage level shifter of Embodiment 1 of the present invention, includes P-channel transistors (FETs) M2 and M3, each of which has a threshold value Vth=−0.36V, and has a source connected to a VPP power supply terminal. Drains of the P-channel transistors M2 and M3 are cross-coupled to gates of the P-channel transistors M3 and M2. The voltage level shifter also includes N-channel transistors M0 and M1, each of which has a threshold value Vth=0.06V. The N-channel transistors M0 and M1 have drains connected to the drains of the P-channel transistors M2 and M3, respectively, and have sources connected to the nodes N0 and N1, respectively, and to gates of the N-channel transistors M1 and M0, respectively.

The voltage level shifter also includes a low threshold value inverter IL0 that receives an input signal (amplitude: VSS-VDD) and that has an output connected to the node N0. The low threshold value inverter includes a depletion type P-channel transistor M19 and a depletion N-channel type transistor M18 that have sources connected to VDD and VSS, respectively, have gates coupled together, and have drains also coupled together. The voltage level shifter also includes an N-channel transistor M16 connected between a low potential side power supply terminal of the inverter IL0 (source of the N-channel transistor M18) and a VSS power supply terminal to operate as a power supply switch.

The voltage level shifter also includes a P-channel transistor M17 connected between a VDD power supply terminal and a high potential side power supply terminal of the inverter IL0 (source of the P-channel transistor M19) to operate as a power supply switch.

The voltage level shifter also includes a low threshold value inverter IL1 that has an input connected to the node N0 and has an output connected to the node N1. The low threshold value inverter IL1 includes a depletion type P-channel transistor M21 and a depletion N-channel type transistor M20 that have sources connected to VDD and VSS, respectively, have gates coupled together and have drains coupled together.

The voltage level shifter also includes an N-channel transistor M22 connected between a low potential side power supply terminal of the inverter IL1 (source of the N-channel transistor M20) and the VSS power supply terminal. The N-channel transistor M22 operates as a power supply switch for power gating.

The voltage level shifter also includes a P-channel transistor M23 connected between the VDD power supply terminal and a high potential side power supply terminal of the inverter IL1 (source of the P-channel transistor M21). The P-channel transistor M23 operates as a power supply switch for power gating.

The voltage level shifter also includes a high threshold inverter IH0 that receives the input signal (amplitude: VSS-VDD) as an input and that has an output connected to the node N0. The high threshold value inverter includes a P-channel transistor M25 and an N-channel transistor M24 that have sources connected to VDD and VSS, respectively, have gates coupled together and have drains coupled together.

The voltage level shifter further includes a high threshold inverter IH1 that has an input connected to the node N0 and has an output connected to the node N1. The high threshold inverter IH1 includes a P-channel transistor M27 and an NMOS transistor M26 that have sources respectively connected to VDD and VSS, have gates coupled together, and having drains coupled together.

As power supply voltages, VPP and VDD are 1.3V and 0.5V, respectively.

The following describes characteristics of the transistors of FIG. 1. The P-channel transistors M2 and M3 are high voltage withstanding transistors, with thick gate oxide films, and with a threshold value Vth set at −0.36V.

The N-channel transistors M0 and M1 are high voltage withstanding transistors, with thick gate oxide films, and with a threshold value Vth set at 0.06V.

The threshold value Vth of each of the P-channel transistors M19 and M21 of the inverters IL0 and IL1 is set at 0.12V, and the threshold value Vth of each of the N-channel transistors M18 and M20 of the inverters IL0 and IL1 is set at −0.12V.

The threshold value Vth of each of the P-channel transistors M25 and M27 of the inverters IH0 and IH1 is set at −0.18V, and the threshold value Vth of each of the N-channel transistors M24 and M26 of the inverters IH0 and IH1 is set at 0.18V.

The threshold value Vth of each of the P-channel transistors M17 and M23, constituting power supply switches, is set at −0.18V, and the threshold value Vth of each of the N-channel transistors M16 and M22 is set at 0.18V.

The following describes the operation of the circuit of FIG. 1. During an active state, the control signal PDT is set to Low and the control signal PDB is set to High. The transistors M16, M17, M22 and M23 are turned on (made conductive) and hence the inverters IL0 and IL1 are made active. When IN is High, the nodes N0 and N1 become Low and High, respectively. The transistor M0 is turned on, the transistor M1 is turned off, and the transistor M3 is turned on, so that the voltage at OUT is VPP (High).

When IN is Low, the nodes N0 and N1 become High and Low, respectively. The transistor M1 is turned on, the transistor M0 is turned off, the transistor M2 is turned on, and the transistor M3 is turned off, so that the voltage at OUT is VSS (Low).

During a standby state, PDT is set to High and PDB is set to Low. Transistors M16, M17, M22 and M23 are turned off. The inverters IL0 and IL1 are not in operation because their power supply paths are cut off. However, the inverters IH0 and IH1 are in operation. When IN is Low during the standby state, the output nodes N0 and N1 of the inverters IH0 and IH1 become High and Low, respectively. The transistor M1 is turned on, the transistor M0 is turned off, the transistor M2 is turned on and the transistor M3 is turned off, so that the voltage at OUT is VSS.

At this time, a leakage current on a route of VPP→M2 (gate=Low)→M0 (gate=Low)→M25 (gate=Low)→VDD is suppressed. On the other hand, a leakage current on a route of VPP→M2 (gate=Low)→M0 (gate=Low)→M24 (gate=Low)→VSS is also suppressed. It is because the transistor M24 with the Low gate voltage is an enhancement type N-channel transistor (Vth=0.18V), and the transistor M25 with the Low gate voltage is an enhancement type P-channel transistor (Vth=−0.18V) and the transistors M24 and M25 are not low threshold voltage transistors. A leakage current on a route of VPP→M3 (gate=High)→M1 (gate=High)→M26 of IH1 (gate=High)→VSS is also suppressed because the transistor M26 with the High gate voltage is an enhancement type high threshold value N-channel transistor (Vth=0.18V). No sub-threshold current flows on a route of VDD→M27 of IH1 (gate=High)→M26 of IH1 (gate=High)→VSS, because the transistor M27 with the High gate voltage is an enhancement type high threshold value P-channel transistor (Vth=−0.18V).

In this manner, the high threshold inverter IH0 is connected, between the input IN and the node N0, in parallel with the low threshold voltage inverter IL0, which is power-gated by a power supply switch (switch transistors M16 and M17). The high threshold inverter IH0 is also connected in parallel with the low threshold voltage inverter IL1 which is power-gated by a power supply switch (switch transistors M22 and M23). The common output node N0 of the inverters IL0 and IH0 and the common output node N1 of the inverters IL0 and IH0 are connected to two input nodes of the voltage level shifter. Such configuration leads to meritorious effects of reducing leakage currents of the inverters IL0 and IL1. Moreover, the number of transistors of a circuit that suppresses the OUT from assuming an intermediate voltage is four (M24 to M27), which is one-half that in the configuration of FIGS. 16A, 16B and 16C (with the number of transistors being eight).

The circuit configuration of Embodiment 1 is effective in case an output of a circuit that supplies a signal to the voltage level shifter outputs High or Low during a standby state, such as in case the circuit is an address or a data latch circuit.

Figure 2:
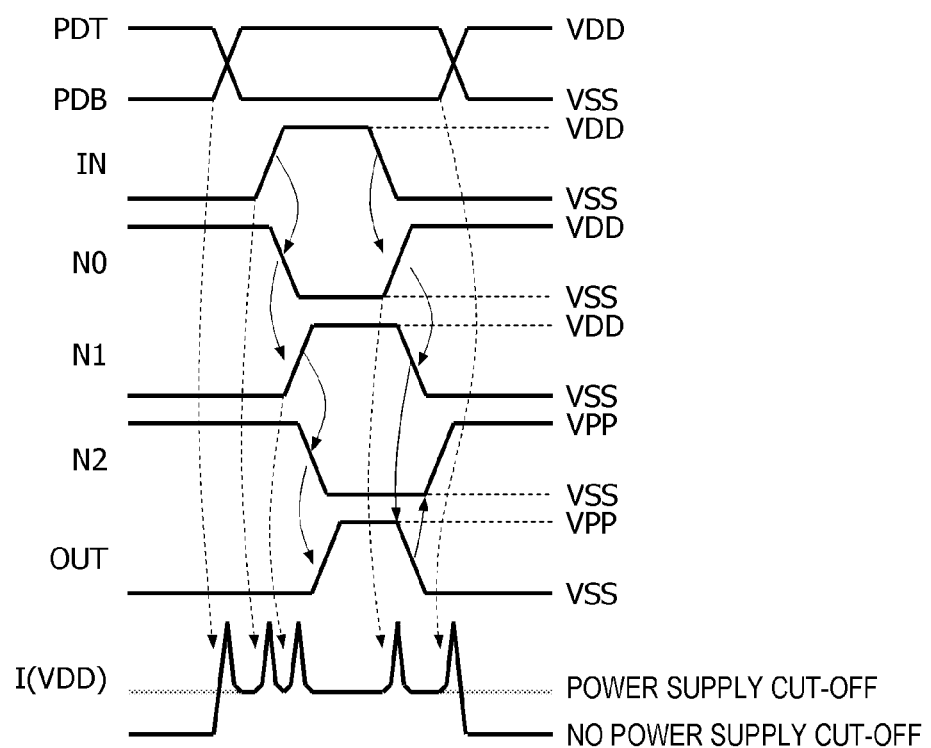
FIG. 2 is a timing waveform diagram showing the configuration of embodiment 1 of the present invention.

FIG. 2 depicts an example timing waveform during the operation of the circuit of Embodiment 1 of FIG. 1, in which voltage waveforms of PDT/PDB, IN, N0, N1, N2 and OUT as well as the power supply current I (VDD) are schematically shown.

When PDT is High and PDB is Low (during standby), power supply to the inverters IL0 and IL1 is cut off (interrupted). When IN is Low, the nodes N0 and N1 are High (VDD) and Low, respectively. N2 is High (at VPP) and OUT=VSS. At this time, the power supply current I (VDD) from VDD to VSS and that from VPP to VDD are suppressed to lower values (see 'power supply cutoff' of I (VDD) of FIG. 2).

In case no power gating is performed during the standby state, as a Comparative Example, the I (VDD) is at a level of 'no power supply cut-off' (current value) in FIG. 2, when IN=Low.

When PDT is Low and PDB is High, the transistors M16, M17, M22 and M23 are turned on, so that the power supply current is supplied to the IL0 and IL1. At OUT, High (VPP) or Low (VSS) appears, depending on IN=High (VPP) or Low (VSS), respectively.

Modification 1 of Embodiment 1

Figure 3:
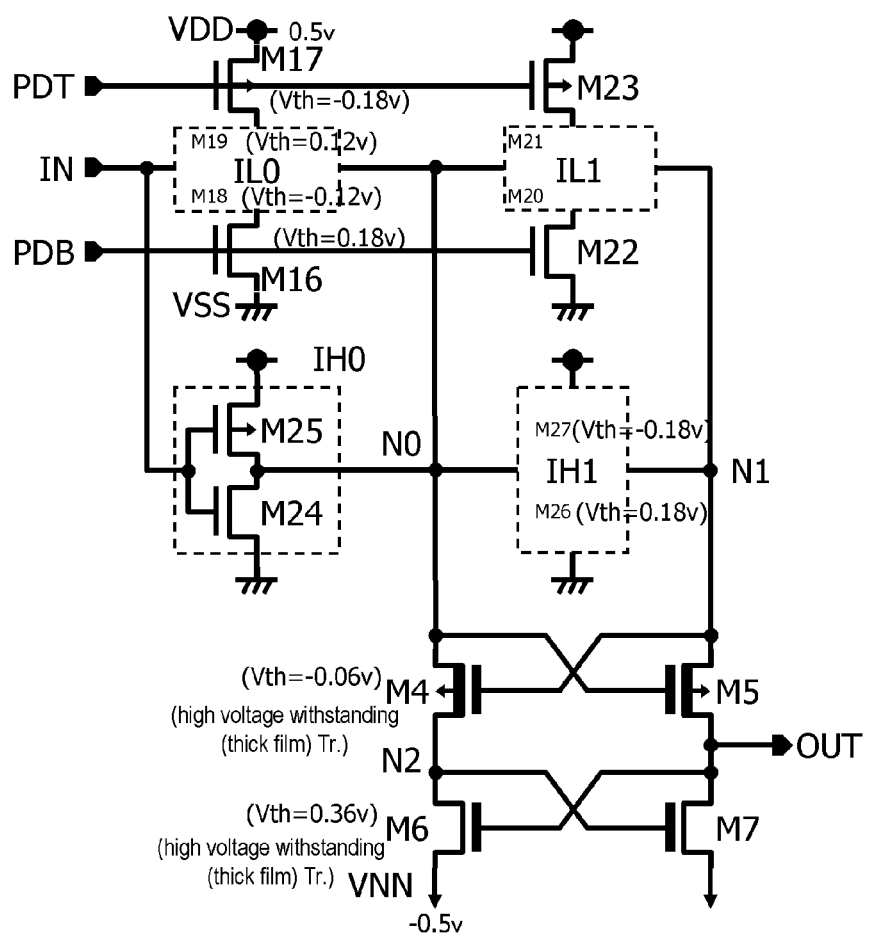
FIG. 3 is a diagram showing a circuit configuration of a modification 1 of embodiment 1 of the present invention.

FIG. 3 shows a modification 1 of Embodiment 1 of the present invention. In the present modification, an input signal with a power supply amplitude of VSS-VDD is converted to a minus power supply potential VNN~VDD, where VNN<0=VSS.

Referring to FIG. 3, this voltage level shifter includes N-channel transistors M6 and M7 that have sources connected to a VNN power supply terminal, have drains cross-coupled to gates of the respective other transistors M7 and M6, P-channel transistors M4 and M5 that have drains connected respectively to the drains of the N-channel transistors M6 and M7 and have sources connected respectively to the nodes N0, N1 and cross-coupled to gates of the respective other transistors M5 and M4, and a low threshold value inverter IL0 that receives an input signal (amplitude: VSS-VDD) and that has its output connected to the node N0. The low threshold value inverter includes a depletion type P-channel transistor M19 and a depletion type N-channel transistor M18 that have sources connected respectively to VDD and VSS, have gates coupled together and have drains coupled together.

The voltage level shifter also includes an N-channel transistor M16 that is connected between the low potential side power supply terminal of the inverter IL0 (source of the N-channel transistor M18) and a VSS power supply terminal, a P-channel transistor M17 that is connected between a VDD power supply terminal and a high potential side power supply terminal of the inverter IL0 (source of a P-channel transistor M19), and a low threshold value inverter IL1 that has an input connected to the node N0 and has an output connected to the node N1. The low threshold value inverter includes a depletion type P-channel transistor M21 and a depletion type N-channel transistor M20 that have sources connected respectively to VDD and VSS, have gates coupled together and have drains coupled together.

The present voltage level shifter also includes an N-channel transistor M22 that is connected between a low potential side power supply terminal of the inverter IL1 (source of the N-channel transistor M20) and the VSS power supply terminal, a P-channel transistor M23 that is connected between the VDD power supply terminal and a high potential side power supply terminal of the inverter IL1 (source of the P-channel transistor M21), and a high threshold value inverter IH0 that receives the input signal IN (amplitude: VSS-VDD) as input and that has an output connected to the node N0. The high threshold value inverter includes a P-channel transistor M25 and an N-channel transistor M24 that have sources connected respectively to VDD and VSS, have gates coupled together and have drains coupled together.

The present voltage level shifter further includes a high threshold value inverter IH1 that has an input connected to the node N0 and that has an output connected to the node N1. The high threshold value inverter includes a P-channel transistor M27 and an N-channel transistor M26 that have sources connected respectively to VDD and VSS, have gates coupled together and have drains coupled together.

VDD is 0.5V and VNN is −0.5V.

The N-channel transistors M6 and M7 are high voltage withstanding transistors, with thick gate oxide films, with the threshold value Vth=0.36V.

The N-channel transistors M4 and M5 are high voltage withstanding transistors, with thick gate oxide films, with the threshold value Vth=−0.06V.

The threshold value Vth of each of the P-channel transistors M19 and M21 of the inverters IL0 and IL1 is set at 0.12V, while the threshold value Vth of each of the N-channel transistors M18 and M20 of the inverters IL0 and IL1 is set at −0.12V.

The threshold value Vth of each of the P-channel transistors M25 and M27 of the inverters IH0 and IH1 is set at −0.18V, while the threshold value Vth of each of the N-channel transistors M24 and M26 of the inverters IH0 and IH1 is set at 0.18V.

The threshold value Vth of each of the P-channel transistors M17 and M23, constituting a power supply switch, is set at −0.18V, while the threshold value Vth of each of the N-channel transistors M16 and M22 is set at 0.18V.

Figure 4:
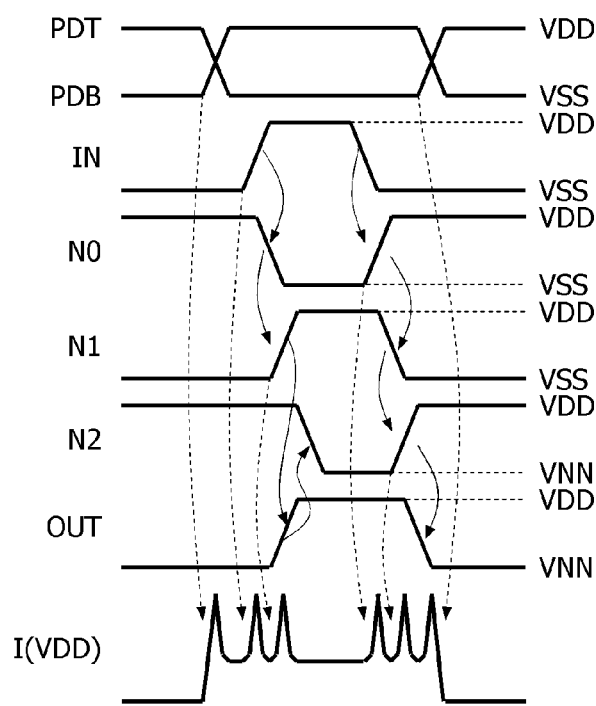
FIG. 4 is a timing waveform diagram of the modification 1 of embodiment 1 of the present invention.

FIG. 4 depicts a timing waveform of the circuit of FIG. 3. In FIG. 4, there are schematically shown voltage waveforms at PDT/PDB, IN, N0, N1, N2 and OUT, and a power supply current I (VDD). With PDT=High and PDB=Low, the power supply to the inverters IL0, IL1 is cut off.

When IN is Low, the nodes N0 and N1 are High (VDD) and Low (VSS), respectively, and the N2 is High (VDD). Thus, the transistor M4 is turned on, the transistor M5 is turned off and the transistor M7 is turned on, so that OUT is VNN (−0.5V). At this time, the current I (VDD) from VDD to VNN and that from VDD to VSS are suppressed to a lower value. If, by way of a Comparative Example, no power gating is performed, the I (VDD) is at a level of no power supply cut-off.

When IN is High, the nodes N0 and N1 are respectively Low (VSS) and High (VDD). the transistor M5 is turned on, the transistor M4 is turned off, the transistor M7 is turned off and the transistor M6 is turned on, so that OUT is VDD.

When PDT is Low and PDB is High, the power supply switches M16, M17, M22 and M23 are turned on, so that the power supply current is supplied to the inverters IL0 and IL1 Thus, High (VDD) or Low (VNN) is supplied to OUT according as IN=High (VDD) or IN=Low (VSS), respectively.

In the present modification, the I (VDD) during standby may be suppressed to a lower value as in the Embodiment 1 shown in FIG. 2.

<Modification 2>

Figure 5:
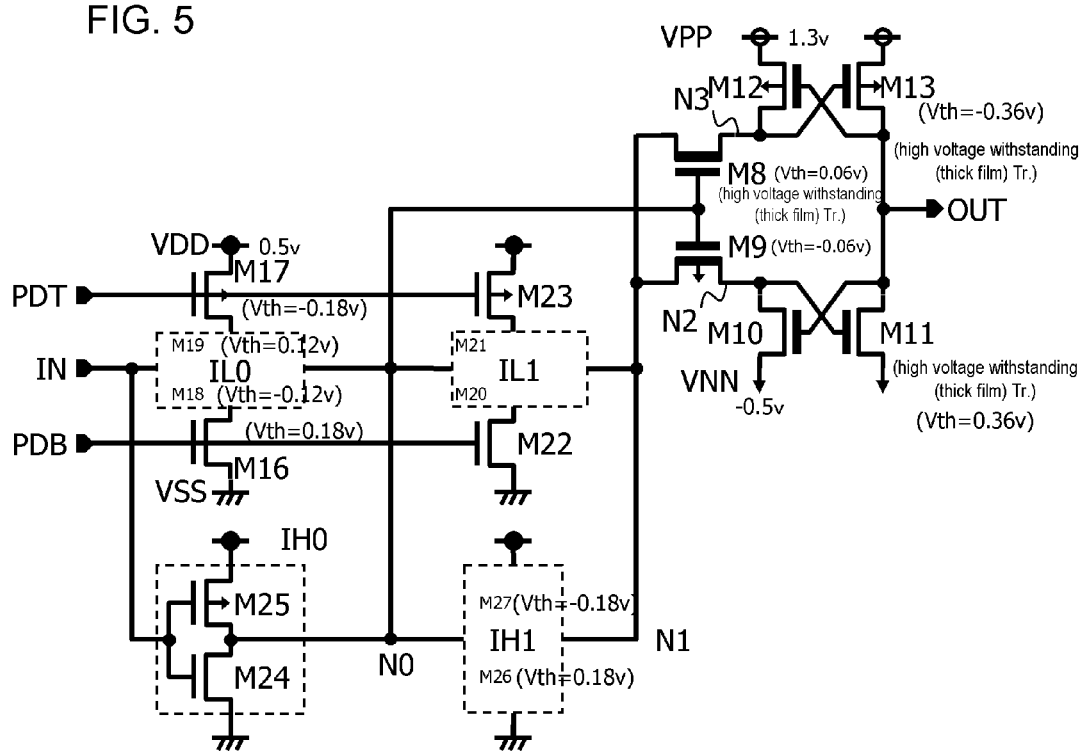
FIG. 5 is a diagram showing a circuit configuration of a modification 2 of embodiment 1 of the present invention.

FIG. 5 shows a voltage level shifter of a modification 2 of Embodiment 1 of the present invention. Referring to FIG. 5, in the voltage level shifter, there are provided P-channel transistors M12 and M13, that have sources connected to a VPP power supply terminal, and have drains cross-coupled to gates of the respective other transistors M13 and M12, an N-channel transistor M11 that has a drain connected to the drain of the P-channel transistor M13 and has a source connected to a node VNN terminal, an N-channel transistor M10 that has a drain connected to the gate of the N-channel transistor M11, has a gate connected to the drain of the M11 and has a source connected to the VNN terminal, an N-channel transistor M8 that is connected between the drain of the transistor M12 (node N3) and the node N1 and has a gate connected to the node N0, a P-channel transistor M9 that is connected between the drain of the transistor M10 (node N2) and the node N1 and has a gate connected to the node N0, a low threshold value inverter IL0 that has an input connected to IN and has an output connected to the node N0. The low threshold value inverter includes a depletion type P-channel transistor M19 and a depletion type N-channel transistor M18 that have sources connected respectively to VDD and VSS, have gates coupled together and have drains coupled together.

There are also provided a P-channel transistor M16 that is connected between the VSS power supply terminal and a low potential side power supply terminal of the inverter IL0 (source of the N-channel transistor M18), a P-channel transistor M17 that is connected between the VDD power supply terminal and a high potential side power supply terminal of the inverter IL0 (source of the P-channel transistor M19), and.

a low threshold value inverter IL1 that has an input connected to the node N0 and has an output connected to the node N1. The low threshold value inverter includes a depletion type P-channel transistor M21 and a depletion type N-channel transistor M20 that have sources connected respectively to VDD and VSS, have gates coupled together and have drains coupled together.

The voltage level shifter also includes an N-channel transistor M22, that is connected between a low potential side power supply terminal of the inverter IL1 (source of the N-channel transistor M20) and the VSS power supply terminal, a P-channel transistor M23 that is connected between the VDD power supply terminal and a high potential side power supply terminal of the inverter IL1 (source of the P-channel transistor M21), and a high threshold value inverter IH0 that receives an input signal (amplitude: VSS-VDD) as input and that has an output connected to the node N0. The low threshold value inverter includes a P-channel transistor M25 and an N-channel transistor M24 that have sources connected respectively to VDD and VSS, have gates coupled together and have drains coupled together.

The present voltage level shifter further includes a high threshold value inverter IH1 that has an input connected to the node N0 and has an output connected to the node N1. The high threshold value inverter includes a P-channel transistor M27 and an N-channel transistor M26, that have sources connected respectively to VDD and VSS, have gates coupled together and have drains coupled together.

VPP is 1.3V, VDD is 0.5V and VNN is −0.5V.

The P-channel transistors M12 and M13 are high voltage withstanding transistors, with thick gate oxide films, with the threshold value Vth=−0.36V.

The N-channel transistors M10 and M11 are high voltage withstanding transistors, with thick gate oxide films, with the threshold value Vth=0.36V.

The threshold value Vth of each of the P-channel transistors M19 and M21 of the inverters IL0 and IL1 is set at 0.12V, while the threshold value Vth of each of the N-channel transistors M18 and M20 is set at −0.12V.

The threshold value Vth of each of the P-channel transistors M25 and M27 of the inverters IH0 and IH1 is set at −0.18V, while the threshold value Vth of each of the N-channel transistors M24 and M26 is set at 0.18V.

The threshold value Vth of each of the P-channel transistors M17 and M23, constituting a power supply switch, is set at −0.18V, while the threshold value Vth of each of the N-channel transistors M16 and M22 is set at 0.18V.

The P-channel transistor M9 is a high voltage withstanding transistor with a thick gate oxide film, with the threshold value Vth=−0.06V. The N-channel transistor M8 is a high voltage withstanding transistor with a thick gate oxide film, with the threshold value Vth=0.06V.

Figure 6:
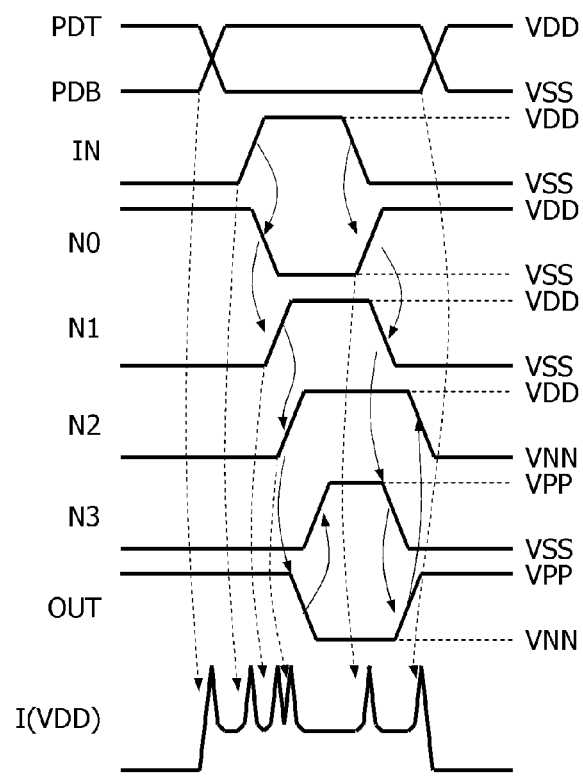
FIG. 6 is a timing waveform diagram of the modification 2 of embodiment 1 of the present invention.

FIG. 6 depicts a timing waveform of the circuit of FIG. 5. In FIG. 6, there are schematically shown voltage waveforms at PDT/PDB, IN, N0, N1, N2, N3 and OUT, and a power supply current I (VDD). With PDT=High and PDB=Low, the power supply to the inverters IL0, IL1 is cut off.

When IN is Low, the nodes N0 and N1 are High (VDD) and Low (VSS), respectively. The N-channel transistor M8, whose gate receives the potential at the node N0, is turned on, while the P-channel transistor M9 is turned off. The potential at the node N3 becomes equal to the potential VSS at the node N1. This causes the P-channel transistor M13 to turn on, so that the potential at the OUT becomes equal to VPP (inversion of the logic at IN). With the potential at the OUT equal to VPP, the N-channel transistor M10 that has its gate connected to OUT, is turned on. The drain potential of the N-channel transistor M10 is equal to VNN (−0.5V). The N-channel transistor M11 that has its gate connected to the drain of the N-channel transistor M10, is turned off. Since the P-channel transistor M9 is turned off, the node N1 (=VSS) is not electrically connected to the power supply VNN, to which the source of the on-state N-channel transistor M10 is connected.

When IN is High, the nodes N0 and N1 are Low (VSS) and High (VDD), respectively. The P-channel transistor M9, whose gate receives the potential at the node N0, is turned on, while the N-channel transistor M8 is turned off. The potential at the node N2 becomes High. This causes the N-channel transistor M11 to turn on, so that the potential at the OUT becomes equal to VNN (inversion of the logic at IN). With the potential at the OUT equal to VNN, the P-channel transistor M12, that has its gate connected to OUT, is turned on. The drain potential of the P-channel transistor M12 is equal to VPP. The P-channel transistor M13 that has its gate connected to the drain of the P-channel transistor M12, is turned off. Since the N-channel transistor M8 is off, the node N1 (=VDD) is not electrically connected to the power supply VPP, to which the source of the on-state P-channel transistor M12 is connected.

In the present modification, a leakage current I (VDD) during standby (PDT=High, PDB=Low) is suppressed to a lower value, as in Embodiment 1 above.

Embodiment 2

Figure 7A:
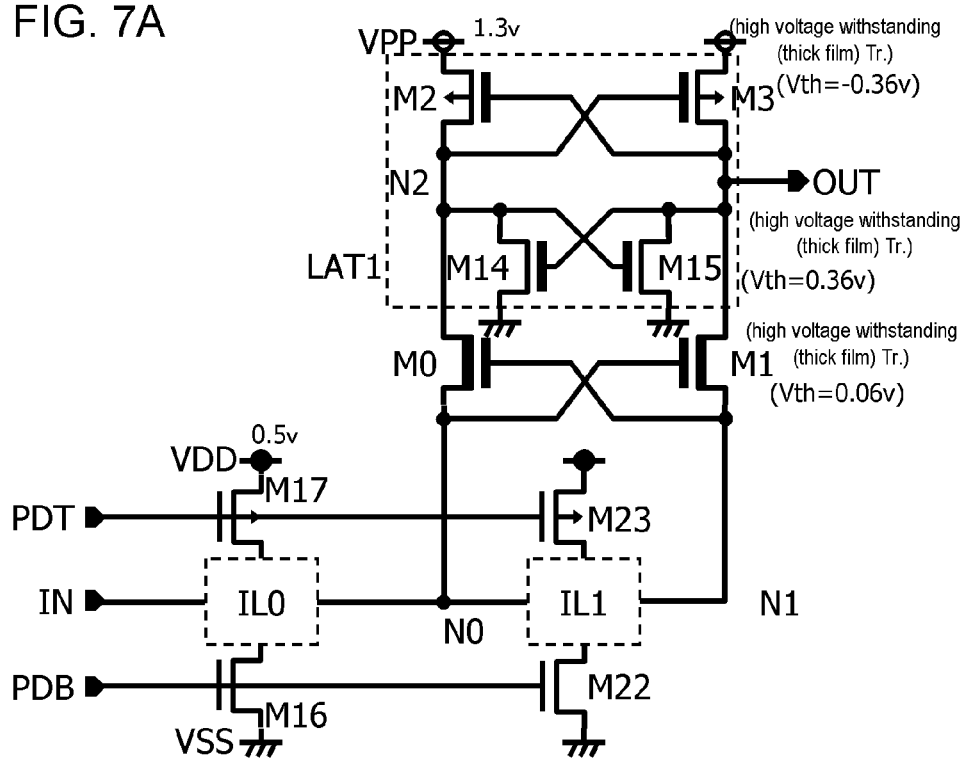
FIGS. 7A and 7B are diagrams showing circuit configurations of an embodiment 2 of the present invention.

FIG. 7A shows a configuration of Embodiment 2 of the present invention. In Embodiment 2, there lack inverters IH0 and IH1, in distinction from Embodiment 1 of FIG. 1. The configuration of Embodiment 2 includes an N-channel transistor M14, whose drain is connected to a node N2 that connects drains of an N-channel transistor M0 and a P-channel transistor M2 and whose source is connected to ground, an N-channel transistor M15, whose drain is connected to a node OUT that connects drains of an N-channel transistor M1 and a P-channel transistor M3 and whose source is connected to ground. The gates of the N-channel transistors M14 and M15 are connected respectively to the drains of the N-channel transistors M15 and M14. The P-channel transistors M2 and M3 and the N-channel transistors M14 and M15 constitute a CMOS differential latch LAT1 that latches the node N2 and the OUT. The power gating configuration including transistors M16 and M17, an inverter IL0, transistors M22 and M23 and an inverter IL1, is similar to that of FIG. 1. When PDT is High and PDB is Low, the nodes N0 and N1 are in a floating state. However, the OUT maintains the VPP or VSS potential by the CMOS latch LAT1.

VPP is 1.3V and VDD is 0.5V.

The P-channel transistors M2 and M3 are high voltage withstanding transistors, with thick gate oxide films, and are set at a threshold voltage Vth=−0.36V.

The N-channel transistors M0 and M1 are high voltage withstanding transistors, with thick gate oxide films, and are set at a threshold voltage Vth=0.06V.

The N-channel transistors M14 and M15 are high voltage withstanding transistors, with thick gate oxide films, and are set at a threshold voltage Vth=0.36V.

The threshold values Vth of the P-channel transistors and the N-channel transistors of the inverters IL0 and IL1 are set at 0.12V and at −0.12V, respectively, as in FIG. 1.

The threshold value Vth of each of the P-channel transistors M17 and M23, composing a power gating power supply switch, is set at −0.18V, as in FIG. 1, while the threshold value Vth of each of the N-channel transistors M16 and M22 is set at 0.18V.

In the present Example, the level at the OUT is suppressed from becoming equal to the intermediate potential (floating potential) by the cross-coupled transistors M14 and M15.

By adding the transistors (high voltage withstanding transistors) M14 and M15, the same logic as that of IN may be supplied to the OUT. The leakage currents of IL0 and IL1 may be reduced even though the IN level is indefinite.

Figure 7B:
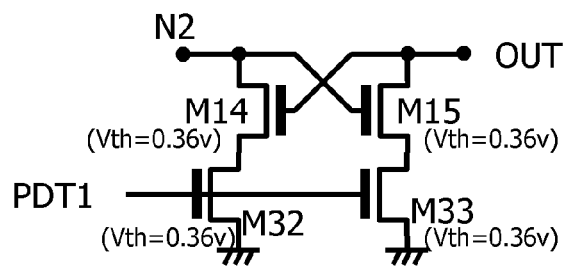

In FIG. 7B, an N-channel transistor M32 is connected between the source of the N-channel transistor M14 of FIG. 7A and a VSS power supply terminal, and an N-channel transistor M33 is connected between the source of the N-channel transistor M15 of FIG. 7A and the VSS power supply terminal. The control signal PDT1 is supplied in common to gates of the N-channel transistors M32 and M33 (see FIG. 16A).

As in FIG. 7A, the N-channel transistors M14 and M15 are high voltage withstanding transistors, each with a thick gate film, with the threshold value Vth=0.36V. The N-channel transistors M32 and M33 are high voltage withstanding transistors, each with a thick gate film, with the threshold value Vth=0.36V.

During a standby state, that is, with PDT1=High, the N-channel transistors M32 and M33 are turned on, so that the latch circuit LAT1 of FIG. 7A is set into operation (activated).

During the active state, that is, with the PDT1=Low, the N-channel transistors M32 and M33 are turned off, thus cutting off the path between the sources of the N-channel transistors M14 and M15 and VSS. Hence, the latch circuit LAT1 of FIG. 7A is not in operation (deactivated). This suppresses the inversion delay of OUT responsive to the inversion of IN during the active state. For example, when the input signal IN is Low during the active state, the node N0 is High, while the node N1 is Low. Hence, the transistor M1 is turned on, the transistor M0 is turned off, the transistor M2 is turned on, and the transistor M3 is turned off, so that OUT is Low (VSS). At this time, the transistor M15 is turned on, and the transistor M14 is turned off to latch OUT at Low (OUT=Low). In this state, when the input signal IN goes High, the node N0 goes Low, while the node N1 goes High. The transistor M0 is turned on and the transistor M1 is turned off. The transistor M0 discharges the node N2, to which the gate of the transistor M3 is connected, from High to Low. The drain of the transistor M14 which is in an off-state is connected to the node N2, while the gate of the transistor M15 which is in an on-state is also connected to the node N2. In order to invert the node N2 from High to Low, it is necessary that electric charge at the node N2 is discharged via the transistor M0 to turn on the transistor M3, thereby bringing OUT to High to turn off the transistor M2. However, in turning the transistor M3 on to pull up the OUT to the VPP potential, the transistor M15 is as yet in an on-state. Hence, it takes time until the OUT rises to the VPP potential. If there is caused a delay in a rise time of OUT, the transistor M14 is turned on with a delay, thus causing a delay in discharging the node N2. Thus, during the active state, PDT1 is set at Low to turn off the transistors M14 and M15 to prevent the latch function from coming into operation.

Modification 1 of Embodiment 2

Figure 8:
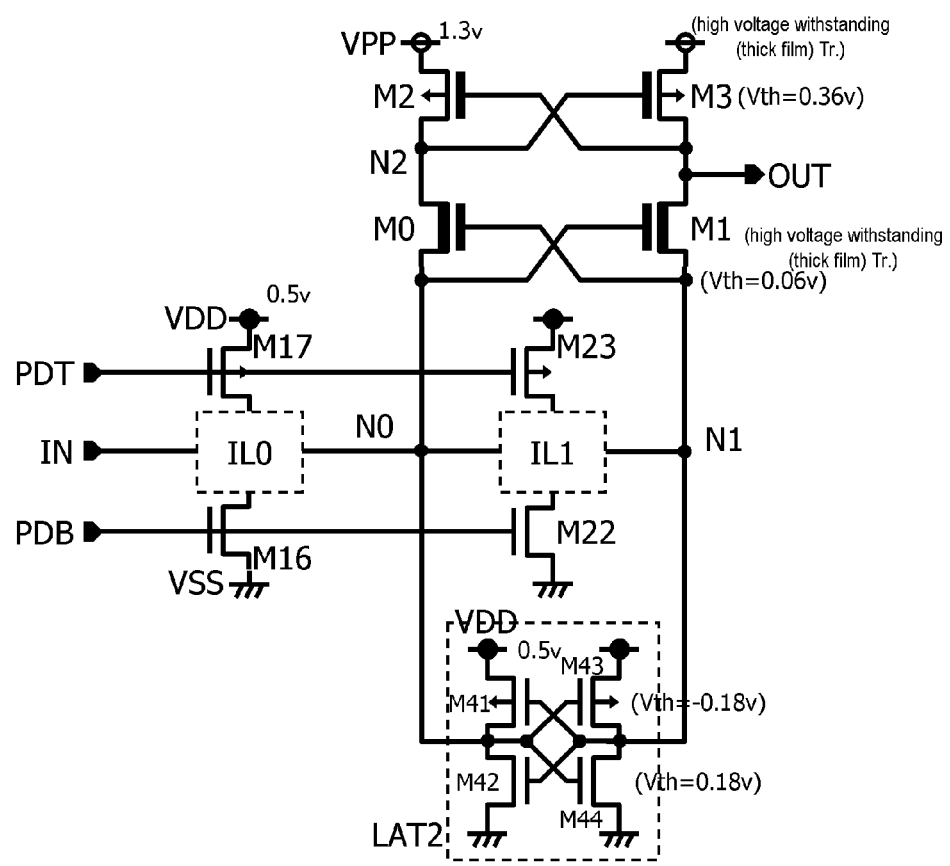
FIG. 8 is a diagram showing a circuit configuration of a modification 1 of embodiment 2 of the present invention.

FIG. 8 shows the configuration of a modification 1 of Embodiment 2 of the present invention. In distinction from Embodiment 1 of FIG. 1, the voltage level shifter of the present modification is not provided with the high threshold value inverters IH0 and IH1. However, the voltage level shifter is provided with a CMOS differential latch LAT2 whose input and output are connected to the nodes N0 and N1, respectively.

The CMOS differential latch LAT2 includes a first CMOS inverter that comprises a P-channel transistor M41 and an N-channel transistor M42 which are connected between a VDD power supply terminal and a VSS power supply terminal, and a second CMOS inverter that comprises a P-channel transistor M43 and an N-channel transistor M44 which are connected between the VDD power supply terminal and the VSS power supply terminal. The coupled gates and the coupled drains of the first CMOS inverter (M41, M42) are connected to the nodes N1 and N1, respectively, while the coupled gates and the coupled drains of the second CMOS inverter (M43, M44) are connected to the nodes N0 and N0, respectively.

The N-channel transistors M42 and M44 are low voltage withstanding transistors (thin-film transistors), with the threshold value Vth=0.18V. The P-channel transistors M41 and M43 are low voltage withstanding transistors (thin-film transistors), with the threshold value Vth=−0.18V.

The latch circuit LAT2 is adapted to keep the potential of the nodes N0 and N1 to be in an inverted relationship to each other during the operation. The latch circuit LAT2 is connected to the nodes N0 and N1 and, in this respect, the present modification differs from the Embodiment 2. By the transistors M0 and M1, also performing the role of a voltage divider, the potentials at the nodes N0 and N1 are of the amplitude of VDD to VSS. The latch circuit LAT2 may be configured by thin-film transistors, thus allowing reducing the circuit area as compared with Embodiment 2. Specifically, while the N-channel transistors M14 and M15 of the LAT 1 of Embodiment 2 are driven by a high (boosted-up) voltage VPP, the LAT 2 is driven by the power supply VDD, thus enabling the current consumption to be reduced during the operation.

The transistors M0 to M3 of FIG. 8 may be replaced by transistors M4 to M7 of the modification 1 of the above Embodiment 1 (FIG. 3).

In addition, the transistors M0 to M3 of FIG. 8 may be replaced by transistors M8 to M13 of the modification 2 of Embodiment 1 (FIG. 5). The switch devices M32 and M33 that cut off the power supply path by the control signal PDT1 of FIG. 7B may be connected between the transistors M42 and M44 of LAT2 of FIG. 8 and the VSS power supply terminal.

Modification 2 of Embodiment 2

Figure 9:
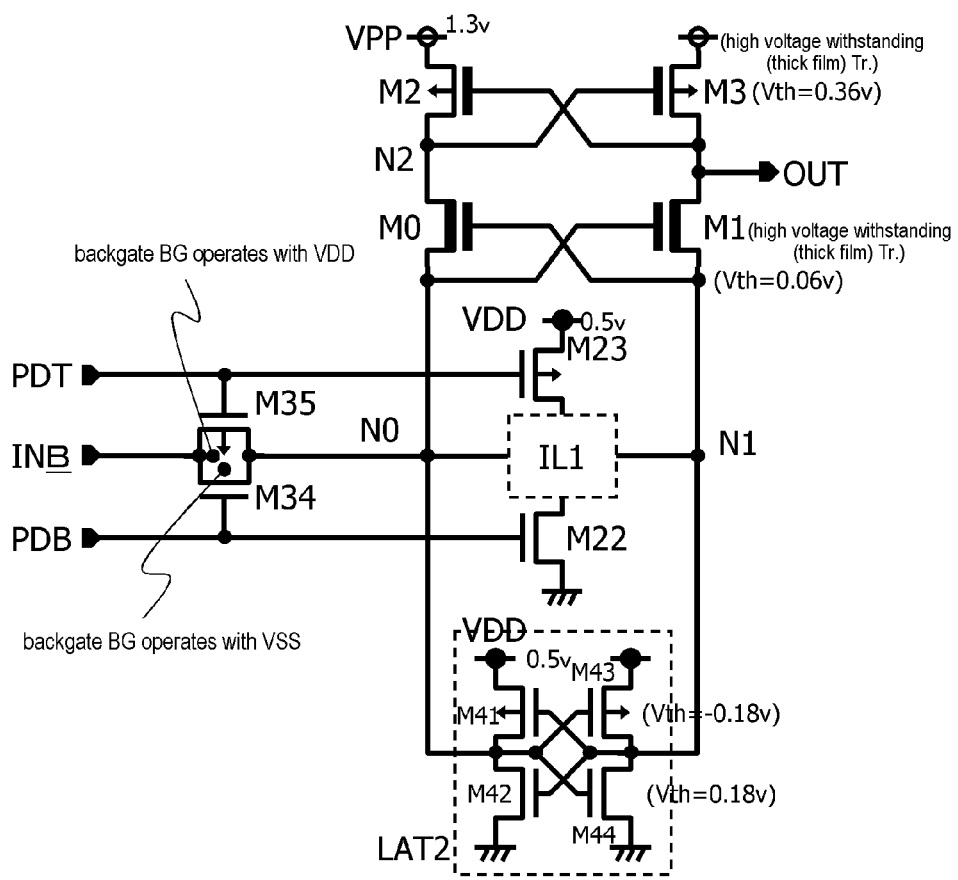
FIG. 9 is a diagram showing a circuit configuration of a modification 2 of embodiment 2 of the present invention.

FIG. 9 shows the configuration of a modification 2 of Embodiment 2 of the present invention. Referring to FIG. 9, the present modification is similar to the modification 1 of Embodiment 2 shown in FIG. 8 except that an input INB (inverted version of IN) and the node N0 are connected via a CMOS switch (M34 and M35). A P-channel transistor M35, whose gate receives a signal PDT, and an N-channel transistor M34, whose gate receives a signal PDB which is complementary to PDT, are connected parallel to each other between the INB and the node N0. A backgate of the P-channel transistor M35 is at the VDD potential, and a backgate of the N-channel transistor M34 is at the VSS potential.

The present modification is effective in case, for example, the IN is used as a bidirectional bus and the present level shifter is used as a receiver circuit.

The transistors M0 to M3 of FIG. 9 may be replaced by the transistors M4 to M7 of the modification 1 of Embodiment 1 (FIG. 3).

The transistors M0 to M3 of FIG. 9 may be replaced by the transistors M8 to M13 of the modification 2 of Embodiment 1 (FIG. 5).

The switch elements M32 and M33 that turn off the power supply path by the control signal PDT1 of FIG. 7B may be provided between the transistors M42 and M44 of LAT2 and VSS.

Embodiment 3

Figure 10:
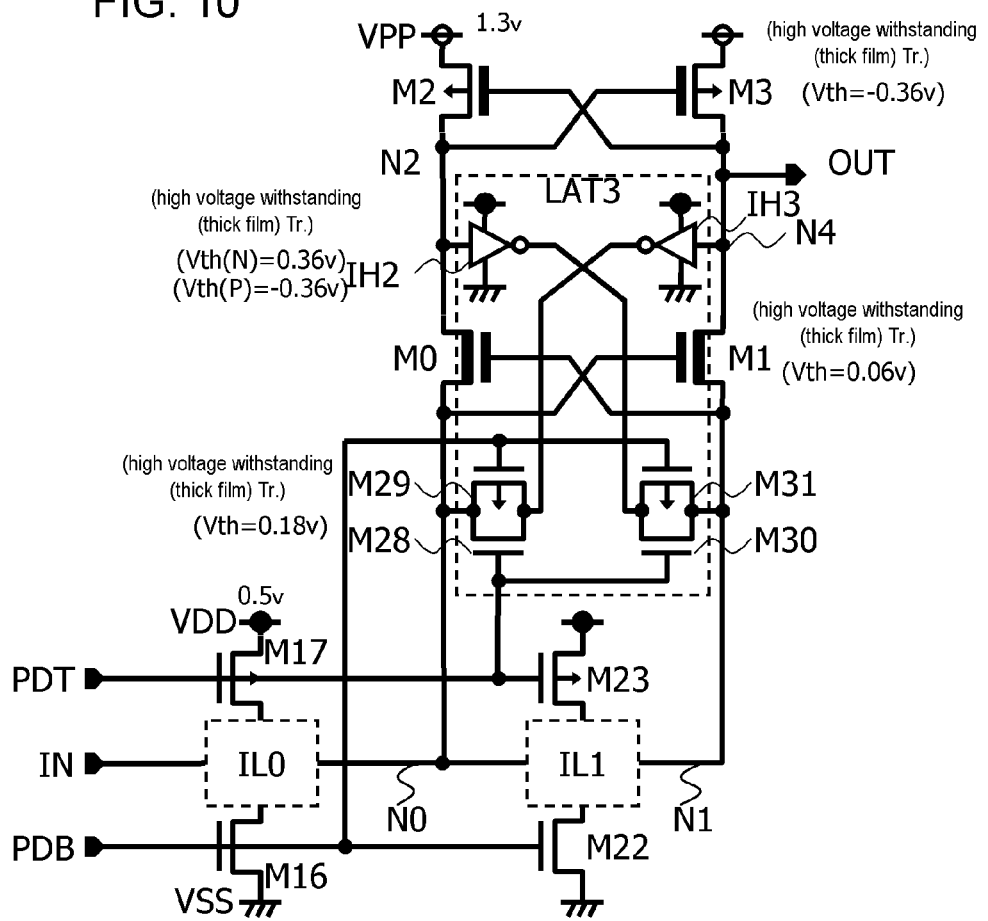
FIG. 10 is a diagram showing a circuit configuration of embodiment 3 of the present invention.

FIG. 10 shows a configuration of Embodiment 3 of the present invention. Referring to FIG. 10, the voltage level shifter of the present Example is not, in distinction from the Embodiment 1 of FIG. 1, provided with the high threshold value inverters IH0 and IH1. This voltage level shifter is provided with N-channel transistors M28 and M30, P-channel transistors M29 and M31 and with inverters IH2 and IH3. The inverter IH2 is connected between the VDD power supply terminal and the VSS power supply terminal, and has an input connected to a node N2 (the node connecting the drain of the P-channel transistor M2 and the drain of the N-channel transistor M0). The inverter IH3 is connected between the VDD power supply terminal and the VSS power supply terminal, and has an input connected to a node OUT (the node connecting the drain of the P-channel transistor M3 and the drain of the N-channel transistor M0. The transistors M28 and M29 are connected in parallel between an output of the inverter IH3 and the node N0 to compose a CMOS switch (transfer gate). The transistors M30, and M31 are connected in parallel between an output of the inverter IH2 and the node N1 to compose another CMOS switch (transfer gate). The gates of the N-channel transistors M28 and M30 are connected in common to PDT. The gates of the P-channel transistors M29 and M31 are connected in common to PDB.

The inverters IH2 and IH3 and the transistors 28 to 31 compose a latch circuit LAT3 that keeps a potential at node N0 and that at node N1 to be in an inverted relation to each other during the operation. Specifically, during the standby state, PDT is set to High and PDB is set to Low and hence the first CMOS switch including the transistors M28 and M29 and the second CMOS switch including the transistors M30 and M31, are both turned on to supply an inverted signal of the node N2, which is output from the inverter IH2, to the node N1, as well as to supply an inverted signal of OUT, which is output from the inverter IH3, to the node N0. It is possible to decrease leakage currents of the inverters IL0 and IL1 even though the IN level is indefinite.

During the active state, PDT is set to Low and PDB is set to High, and hence the first CMOS switch including the transistors M28 and M29 and the second CMOS switch including the transistors M30 and M31, are both turned off.

In the present embodiment, the power supply voltages VPP and VDD are 1.3V and 0.5V, respectively.

The P-channel transistors M2 and M3 are high voltage withstanding transistors, each having a thick gate oxide film, with the threshold voltage Vth=−0.36V. The N-channel transistors M0 and M1 are high voltage withstanding transistors, each having a thick gate oxide films, with the threshold voltage Vth=0.06V.

The N-channel transistors of the inverters IH2 and IH3, are high voltage withstanding transistors, each having a thick gate oxide film, with a threshold voltage Vth=0.36V. The P-channel transistors of the inverters IH2 and IH3, are high voltage withstanding transistors, each having a thick gate oxide film, with the threshold voltage Vth=−0.36V.

The threshold voltages Vth of the P-channel transistors and the N-channel transistors of each of the inverters IL0 and IL1 are set at 0.12V and at −0.12V, respectively, as in FIG. 1. The threshold voltage Vth of each of the P-channel transistors M17 and M23, composing the power supply switches, is set at −0.18V. The threshold voltage Vth of each of the N-channel transistors M16 and M22 is set at 0.18V, as in FIG. 1.

The P-channel transistors M29 and M31 of the first and second CMOS switches, are low voltage withstanding (thin film) transistors, with the threshold voltage Vth=−0.18V. The N-channel transistors M28 and M30 of the first and second CMOS switches are low voltage withstanding (thin film) transistors, with the threshold voltage Vth=0.18V. A high operating speed equivalent to that of the configuration of Embodiment 2 having PDT control may be achieved. In Embodiment 2, outputs at LAT1 (N2) and at IL0 (N0) are shorted, while outputs at LAT1 (OUT) and at IL1 (N1) are also shorted. In the present Embodiment, during the non-standby state (during when the voltage level shifter is activated), the outputs of LAT3 (IH2, IH3) and outputs of IL0 and IL1 are not shorted, because the first CMOS switch (M28, M29) and the second CMOS switch (M30, M31) are both made non-conductive by the power gating signals PDT and PDB, respectively. The transistors M28 to M31 of the CMOS switch are connected to the nodes N0 and N1 and are composed by low voltage withstanding transistors. Hence, the present embodiment may be implemented with a circuit area smaller than in case these transistors M28 to M31 are high voltage withstanding transistors.

In FIG. 11, characteristics of the transistors (reference figures or numerals) of the above described respective embodiments, that is, whether the transistors in question are of high voltage withstanding types, with thick gate oxide films, or of low voltage withstanding types, with thin gate oxide films, conductivity types and the threshold values (Vth) of the transistors, are shown as a list.

Embodiment 4

Figure 12A:
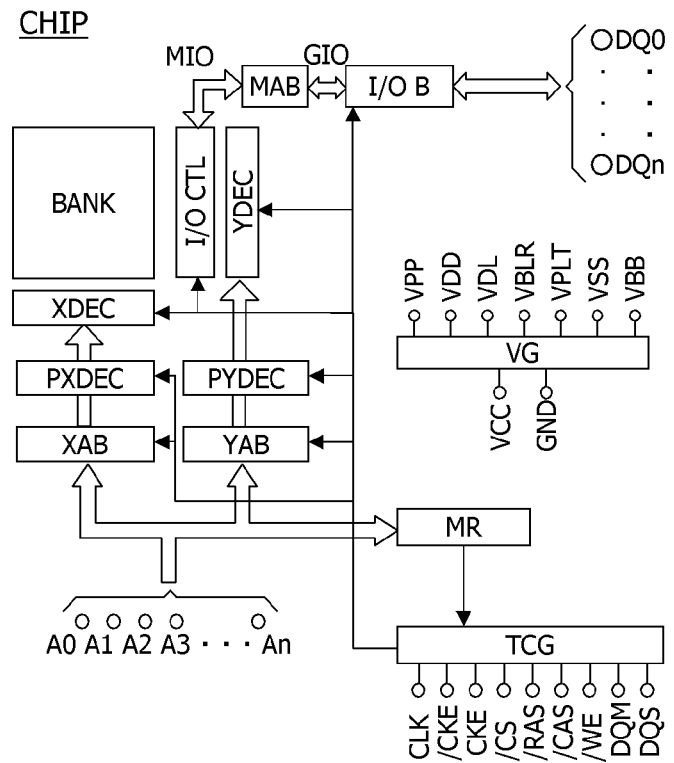
FIG. 12A is a schematic diagram showing the overall semiconductor device configuration of embodiment 4.
Figure 12B:
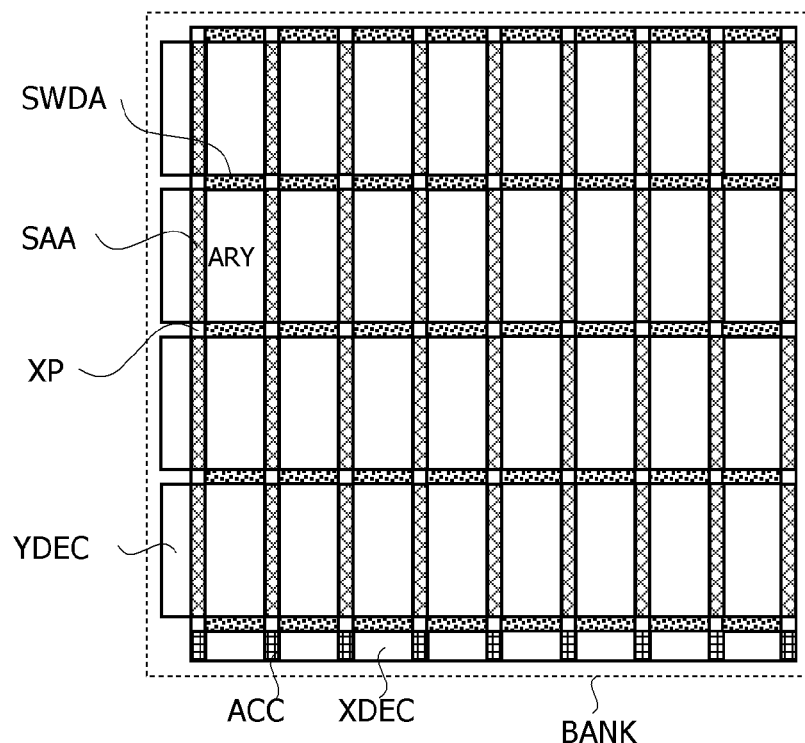
FIG. 12B is a plan view showing a bank configuration of the semiconductor device.

FIG. 12A depicts a functional block diagram schematically showing the configuration of an entire semiconductor memory device (CHIP). FIG. 12B depicts a block diagram schematically showing an example configuration of a bank (BANK), where BANK designates a bank of a plurality of memory cell arrays. In these figures, XAB is an address buffer that receives an X-address of an input address signal at address terminals A0 to An, and YAB is an address buffer that receives a Y-address of the input address signal at the address terminals A0 to An. PXDEC designates a pre-decoder of the X-address. XDEC designates a row decoder including a word driver that decodes an output of the pre-decoder PXDEC to drive a selected word line to a high voltage, such as a boosted-up voltage VPP. PYDEC designates a pre-decoder of the Y-address and YDEC decodes an output of the pre-decoder PYDEC to turn on a column switch of a selected column. I/O CTL designates an input/output control circuit. MAB designates a data amplifier block that amplifies data read out from a MIO (main IO) line and that drives write data to the MIO. I/O B designates a bidirectional (input/output) buffer. DQ0 to DQn designate data terminals. MR designates a mode register. TCG (Timing Control Generator) receives a clock signal and a command signal to generate a variety of control timing signals. CLK is an external clock, CKE and /CKE are clock enable signals. An internal clock signal generated from the external clock CLK is provided to internal circuits when the CKE is High. /CS is a chip select signal. /RAS and /CAS are a row address strobe signal and a column address strobe signal. /WE is a write enable signal, DQM is a data mask signal and DQS is a strobe signal for data input/output. VG designates a power supply voltage generator, and generates high voltages VPP, VDD, a sense amplifier driving voltage VDL, a pre-charging voltage VBLR, a plate voltage VPLT, VSS and a substrate bias voltage (minus voltage) VBB. The level shifter of the above Example may be applied to a word driver for XDEC.

Referring to FIG. 12B, ARY designates a memory array. XDEC is an X-decoder. SWDA is a sub-word driver string (array). ACC is an array control circuit. YDEC is a column decoder. SAA is a sense amplifier string (array) and XP is a crossing area between adjoining mats.

Figure 13A:
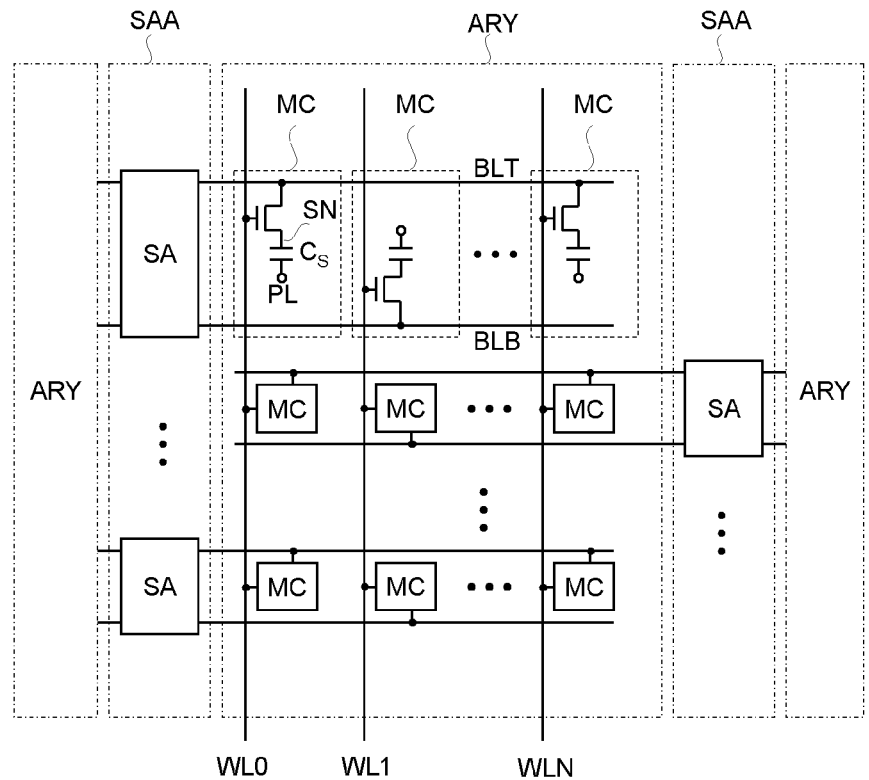
FIGS. 13A and 13B show a folding bit line configuration and an open bit line configuration, respectively.

FIG. 13A shows an example configuration of a circuit of the memory array (ARY) of FIG. 12B (folding bit line configuration). In FIG. 13A, MC is a dynamic memory made up of an NMOS transistor and a capacitance Cs. The NMOS transistor has a gate connected to a word line, such as WL0, has one of a drain and source connected to a bit line and has the other of the drain and source connected to one end (SN) of the capacitance Cs, the other end of which is connected to a plate power supply PL. SA designates a sense amplifier that differentially inputs pair bit lines BLT/BLB to differentially amplify the pair bit lines. The SA is shared by the pair bit lines BLT/BLB of the arrays (ARYs) on both sides of the sense simplifier string (SAA). A transfer gate between the pair bit lines BLT/BLB and the sense amplifier SA is not shown. A plurality of pair bit lines BLT/BLB are alternately connected to both side sense amplifiers in such a manner that the first pair bit lines BLT/BLB (the uppermost bit line pair in the drawing) are connected to the left-side sense amplifier A in FIG. 13A, the second pair bit lines BLT/BLB (the second uppermost bit line pair in the drawing) is connected to the right-side sense amplifier A in FIG. 13A and so on. This configuration exhibits excellent noise immunity because a folded bit line is arranged parallel and adjacent to the bit line connecting to the cell MC connected to the selected word line.

Figure 13B:
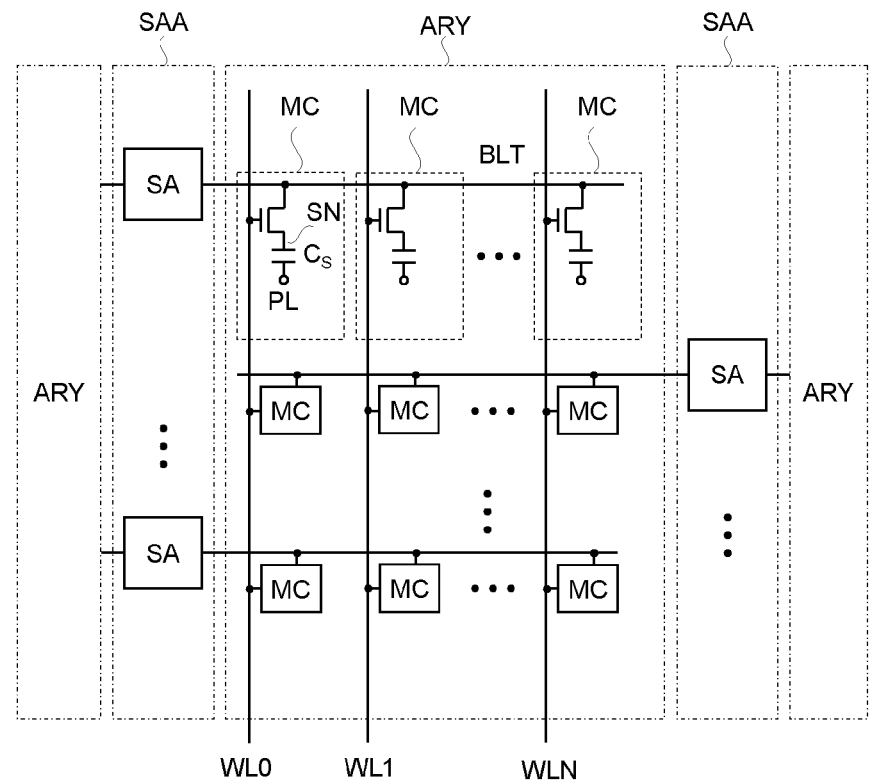

FIG. 13B shows an example configuration of a second circuit of the memory array (ARY) (open bit line configuration). A plurality of pair bit lines BLT/BLB of the memory array (ARY) are alternately connected to both side sense amplifiers in such a manner that the first pair bit lines BLT (the uppermost bit line pair in the drawing) are connected to the left-side sense amplifier A in FIG. 13B, the second pair bit lines BLT (the second uppermost bit line pair in the drawing) are connected to the right-side sense amplifier A in FIG. 13A and so on. The open bit line configuration has come into use in keeping pace with miniaturization and high integration of semiconductor devices.

Figure 14A:
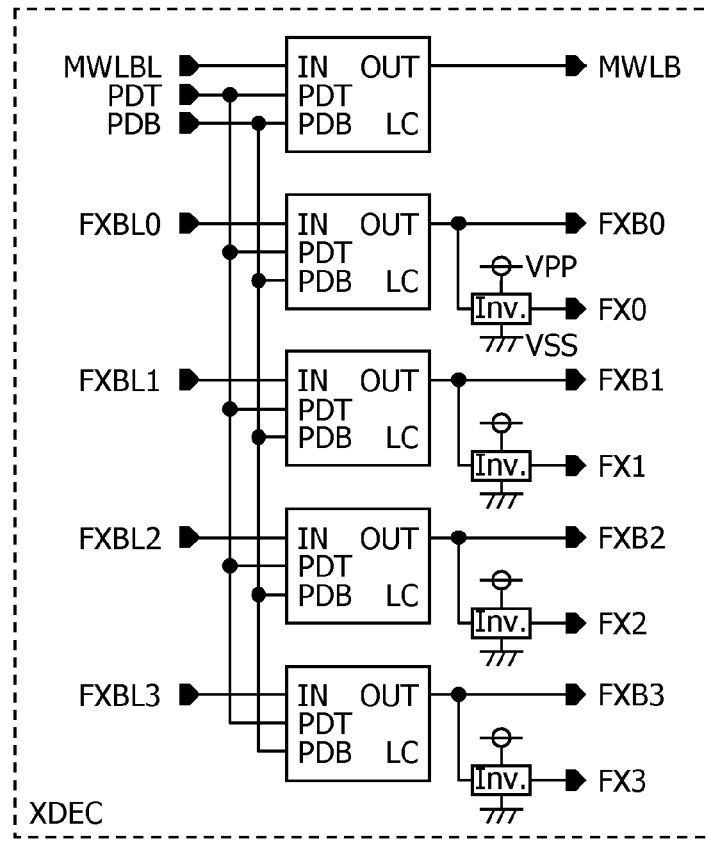
FIG. 14A is a circuit diagram showing the configuration of XDEC of FIG. 12A.

FIG. 14A depicts a circuit block diagram showing the row decoder (XDEC) of FIG. 13A. The row decoder includes a plurality of level shifters LCs. Each level shifter LC receives standby control signals PDT and PDB. During standby, standby control signals PDT and PDB are High and Low, respectively. MWLB, supplied to the voltage level shifter, is a main word line signal. FXB0 to FXB3 and FX0 to FX3 are sub-word line signals. Each level shifter receives MWLBL and FXBL0 to FXBL3, with amplitude VDD/VSS, and outputs MWLB and FXB0 to FXB3, with amplitude VPP/VSS. FX0 to FX3 are generated by inverting the FXB0 to FXB3 by inverters. The amplitudes of FX0 to FX3 are VPP-VSS. In case the configuration of FIG. 5 is used as level shifter LC, the amplitudes of MWLB and FXB0 to FXB3 are set to VPP-VNN (where VNN assumes a minus voltage). The low potential side supply power of the inverter Inv. of FIG. 14A is not VSS but VNN.

Figure 14B:
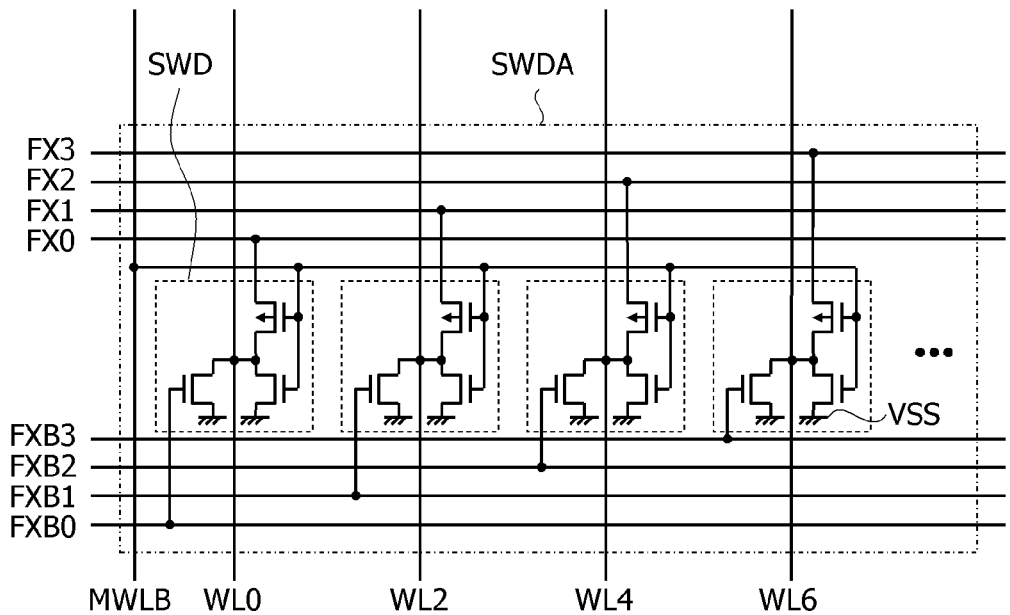
FIG. 14B is a circuit diagram showing the configuration of SWDA of FIG. 12B.
Figure 15A:
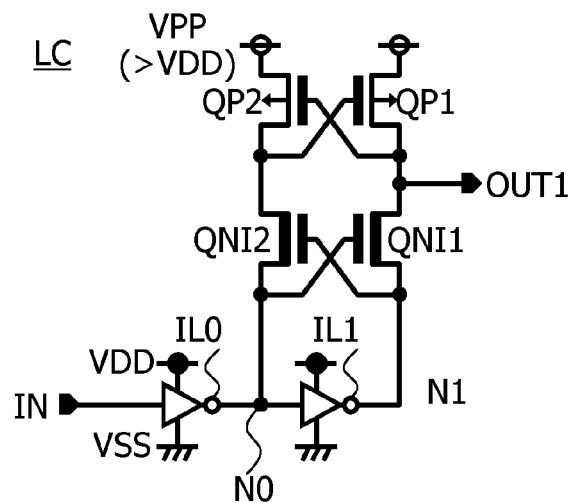
FIG. 15A is a circuit diagram showing the configuration of a related art.
Figure 15B:
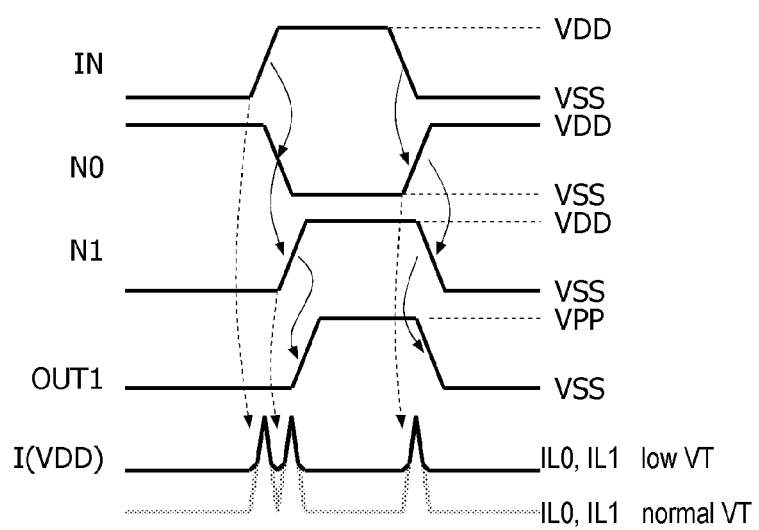
FIG. 15B is a timing waveform diagram of the circuit of FIG. 15A.

FIG. 14B shows essential portions of a sub-word driver string. It is assumed that FX0 is High, FXB0 is Low and the main word line MWLB is Low. In the sub-word drivers (SWD) that is connected to the word line WL0, the PMOS transistor that has a gate, a source and a drain respectively connected to the main word line MWLB, to FX0 and to WL0, is turned on to raise the word line WL0 to a voltage VPP. If FX0 is Low and FXB0 is High, the PMOS transistor of the sub-word driver that is connected to the word line WL0, is turned off. The NMOS transistor that has a gate, a source and a drain respectively connected to FXB0, to the ground and to WL0, is turned on to set the word line WL0 to VSS (Low).

The level shifter of the present embodiment enables the word line WL to be driven at a high speed, even if the power supply VDD voltage is decreased. In addition, the voltage level shifter enables leakage at XDEC to be reduced during the standby state. It is thus possible to implement a high-speed and low-leakage semiconductor memory device.

The technical concept of the present application may be applied not only to a semiconductor memory device but also to other semiconductor devices having voltage level shifters. Additionally, the circuit form in each circuit block shown in the drawings as well as the circuitry that generates control signals is not limited to that disclosed in the embodiments.

The technical concept of the semiconductor device of the present invention may be applied to a large variety of semiconductor devices having voltage level shifters. For example, the present invention may be applied to semiconductor devices in general, inclusive of a CPU (Central Processing Unit), an MCU (Micro Control Unit), a DSP (Digital Signal Processor), an ASIC (Application Specific Integrated Circuit), an ASSP (Application Specific Standard Product) and a memory (Memory). There are a large variety of product forms of the semiconductor devices according to the present invention, such as SOC (system-on-chip), MCP (multi-chip package) or POP (package-on-package). The present invention may be applied to semiconductor devices having these optional product or package forms. As regards transistors, it is sufficient that the transistors used are field effect transistors (FETs), such that any of a number of types of FETs, such as MIS (Metal-Insulator Semiconductor) or TFT (Thin-Film Transistors), may be used in addition to the MOS (Metal Oxide Semiconductor). A fraction of the transistors in the device may also be bi-polar transistors.

It is observed that an N-channel transistor is typical of the transistor of the first conductivity type, and that a P-channel transistor is typical of the transistor of the second conductivity type.

A large variety of combinations or selections of elements disclosed herein may be made within the context of the claims. That is, the present invention may cover a wide variety of modifications or corrections that may occur to those skilled in the art in accordance with the entire disclosure of the present invention, inclusive of claim and the technical concept of the present invention.

What is claimed is:

1. A device comprising:
   first, second and third power supply lines supplied respectively with first, second and third power voltages that are different from one another;
   first and second input terminals and an output terminal;
   an output circuit coupled to the first power supply line, the first and second input terminals and the output terminal;
   a first inverter including an input node coupled to the first input terminal and an output node coupled to the second input terminal;
   a first transistor coupled in series to the first inverter between the second and third power supply lines, the first transistor being rendered non-conductive to deactivate the first inverter and conductive to activate the first inverter; and
   a control circuit configured to prevent the output terminal from being brought into an electrical floating state during deactivation of the first inverter:
   wherein the first power supply line is continuously supplied with the first voltage during both activation and deactivation of the first inverter.

2. The device as claimed in claim 1, wherein the output terminal continuously takes the first power voltage during the deactivation of the first inverter.

3. The device as claimed in claim 1, wherein the first input terminal is continuously fixed at one of the second and third power voltages during the deactivation of the first inverter.

4. A device comprising:
   first, second and third power supply lines supplied respectively with first, second and third power voltages that are different from one another;
   first and second input terminals and an output terminal;
   an output circuit coupled to the first power supply line, the first and second input terminals and the output terminal;
   a first inverter including an input node coupled to the first input terminal and an output node coupled to the second input terminal;
   a first transistor coupled in series to the first inverter between the second and third power supply lines, the first transistor being rendered non-conductive to deactivate the first inverter; and
   a second inverter including an input node coupled to the first input terminal and an output node coupled to the second input terminal.

5. The device as claimed in claim 4, wherein the second inverter is greater in threshold voltage than the first inverter.

6. The device as claimed in claim 5, wherein the output circuit comprises an intermediate node, a third transistor coupled between the first power supply line and the output terminal and including a gate coupled to the intermediate node, a fourth transistor coupled between the first power supply line and the intermediate node and including a gate coupled to the output terminal, a fifth transistor coupled between the output terminal and the second input terminal, and a sixth transistor coupled between the intermediate node and the first input terminal.

7. The device as claimed in claim 6, wherein the fifth transistor includes a gate coupled to the first input terminal, and the sixth transistor includes a gate coupled to the second input terminal.

8. The device as claimed in claim 5, wherein the device further comprises a fourth power supply line supplied with a fourth power voltage that is different from each of the first, second and third power voltages, and the output circuit comprises first and second intermediate nodes, a third transistor coupled between the first power supply line and the output terminal and including a gate coupled to the first intermediate node, a fourth transistor coupled between the first power supply line and the first intermediate node and including a gate coupled to the output terminal, a fifth transistor coupled between the first intermediate node and the second input terminal and including a gate coupled to the first input terminal, a sixth transistor coupled between the output terminal and the fourth power supply line and including a gate coupled to the second intermediate node, a seventh transistor coupled between the second intermediate node and the fourth power supply line and including a gate coupled to the output terminal, and an eighth transistor coupled between the second intermediate node and the second input terminal and including a gate coupled to the first input terminal.

9. The device as claimed in claim 4, wherein the device further comprises a third inverter including an input node supplied with a signal and an output node coupled to the first input terminal, a second transistor coupled in series to the third inverter between the second and third power supply lines and rendered non-conductive to deactivate the third inverter, and a fourth inverter including an input node coupled to the input node of the third inverter and an output node coupled to the first input terminal.

10. The device as claimed in claim 9, wherein the second inverter is greater in threshold voltage than the first inverter and the fourth inverter is greater in threshold voltage than the third inverter.

11. A device comprising:
    first, second and third power supply lines supplied respectively with first, second and third power voltages that are different from one another;
    first and second input terminals and an output terminal;
    an output circuit coupled to the first power supply line, the first and second input terminals and the output terminal;
    a first inverter including an input node coupled to the first input terminal and an output node coupled to the second input terminal;
    a first transistor coupled in series to the first inverter between the second and third power supply lines, the first transistor being rendered non-conductive to deactivate the first inverter; and
    a control circuit configured to prevent the output terminal from being brought into an electrical floating state during deactivation of the first inverter;
    wherein the control circuit comprises a latch circuit.

12. The device as claimed in claim 11, wherein the output circuit comprises an intermediate node, a second transistor coupled between the first power supply line and the output terminal and including a gate coupled to the intermediate node, a third transistor coupled between the first power supply line and the intermediate node and including a gate coupled to the output terminal, a fourth transistor coupled between the output terminal and the second input terminal, and a fifth transistor coupled between the intermediate node.

13. The device as claimed in claim 12, wherein the latch circuit comprises a sixth transistor coupled between the output terminal and the third power supply line and including a gate coupled to the intermediate node and a seventh transistor coupled between the intermediate node and the third power supply line and including a gate coupled to the output terminal.

14. The device as claimed in claim 13, wherein the device further comprises a second inverter including an input node supplied with a signal and an output node coupled to the first input terminal and an eighth transistor coupled in series to the second inverter between the second and third power supply lines, the eighth transistor being rendered non-conductive to deactivate the second inverter.

15. The device as claimed in claim 13, wherein the latch circuit further comprises an eighth transistor inserted between the sixth transistor and the third power supply line and a ninth transistor inserted between the seventh transistor and the third power supply line, each of the eighth and ninth transistors being rendered conductive when the first transistor is rendered non-conductive.

16. The device as claimed in claim 12, wherein the latch circuit comprises a second inverter including an input node coupled to the output terminal, a third inverter including an input node coupled to the intermediate node, a first transfer gate coupled between an output node of the second inverter and first input terminal, and a second transfer gate coupled between an output node of the third inverter and the second input terminal, each of the first and second transfer gates being rendered open when the first transistor being rendered non-conductive.

17. The device as claimed in claim 12, wherein the fourth transistor includes a gate coupled to the first input terminal, and the fifth transistor includes a gate coupled to the second input terminal.

18. The device as claimed in claim 11, wherein the latch circuit including first and second power nodes coupled respectively to the second and third power supply lines and first and second input/output nodes coupled respectively to the first and second input terminals, and the device further comprises a second inverter including an input node supplied with a signal and an output node coupled to the first input terminal and a second transistor coupled in series to the second inverter between the second and third power supply lines, the second transistor being rendered non-conductive to deactivate the second inverter.

19. The device as claimed in claim 18, wherein the fourth transistor includes a gate coupled to the first input terminal, and the fifth transistor includes a gate coupled to the second input terminal.

20. The device as claimed in claim 11, wherein the latch circuit includes second and third inverters coupled respectively to first and second input/output nodes, an input node of the second inverter coupled to the first input/output node, an output node of the second inverter coupled to the second input/output node, an input node of the third inverter coupled to the second input/output node, and an output node of the third inverter coupled to the first input/output node.

* * * * *